(12) United States Patent
Onozuka et al.

(10) Patent No.: US 7,875,481 B2
(45) Date of Patent: Jan. 25, 2011

(54) SEMICONDUCTOR APPARATUS AND METHOD FOR MANUFACTURING THE SAME

(75) Inventors: Yutaka Onozuka, Yokohama (JP); Hiroshi Yamada, Yokohama (JP); Hideyuki Funaki, Tokyo (JP); Kazuhiko Itaya, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 330 days.

(21) Appl. No.: 12/200,177

(22) Filed: Aug. 28, 2008

(65) Prior Publication Data

US 2008/0318356 A1   Dec. 25, 2008

Related U.S. Application Data

(62) Division of application No. 11/678,996, filed on Feb. 26, 2007, now abandoned.

(30) Foreign Application Priority Data

Mar. 29, 2006  (JP) ............... 2006-091242

(51) Int. Cl.
    *H01L 21/00* (2006.01)
(52) U.S. Cl. ............... 438/51; 438/50; 438/55; 438/107; 438/108; 438/110; 438/458; 438/464
(58) Field of Classification Search ............ 438/50–51, 438/55, 107–108, 110, 458, 464
    See application file for complete search history.

(56) References Cited

U.S. PATENT DOCUMENTS

| | | | |
|---|---|---|---|
| 5,866,952 A | 2/1999 | Wojnarowski et al. | |
| 6,159,767 A | 12/2000 | Eichelberger | |
| 6,611,050 B1 | 8/2003 | Ference et al. | |
| 6,706,553 B2 | 3/2004 | Towle et al. | |
| 6,919,508 B2 | 7/2005 | Forcier | |
| 7,294,927 B2* | 11/2007 | Takahashi | 257/724 |
| 7,405,108 B2* | 7/2008 | Burrell et al. | 438/125 |
| 2001/0002727 A1 | 6/2001 | Shiraishi et al. | |
| 2005/0087356 A1 | 4/2005 | Forcier | |
| 2005/0218509 A1* | 10/2005 | Kipnis et al. | 257/723 |

(Continued)

FOREIGN PATENT DOCUMENTS

JP   05267559   10/1993

(Continued)

OTHER PUBLICATIONS

Japanese Office Action dated Mar. 30, 2010 corresponding to U.S. Appl. No. 12/200,177, filed Aug. 28, 2008.

(Continued)

*Primary Examiner*—Kevin M Picardat
*Assistant Examiner*—Bac H Au
(74) *Attorney, Agent, or Firm*—Turocy & Watson, LLP

(57) ABSTRACT

It is made possible to provide a highly integrated, thin apparatus can be obtained, even if the apparatus contains MEMS devices and semiconductor devices. A semiconductor apparatus includes: a first chip comprising a MEMS device formed therein; a second chip comprising a semiconductor device formed therein; and an adhesive layer bonding a side face of the first chip to a side face of the second chip, and having a lower Young's modulus than the material of the first and second chips.

15 Claims, 24 Drawing Sheets

U.S. PATENT DOCUMENTS

| | | | |
|---|---|---|---|
| 2006/0051935 A1* | 3/2006 | Silverbrook | 438/458 |
| 2006/0237806 A1* | 10/2006 | Martin et al. | 257/415 |
| 2007/0031989 A1* | 2/2007 | Knechtel et al. | 438/68 |
| 2007/0128828 A1* | 6/2007 | Chen et al. | 438/458 |

FOREIGN PATENT DOCUMENTS

| | | |
|---|---|---|
| JP | 07007134 | 1/1995 |
| JP | 09172137 | 6/1997 |
| JP | 2001-189424 | 7/2001 |
| JP | 2001332654 | 11/2001 |
| JP | 2002353398 | 12/2002 |
| JP | 2003084008 | 3/2003 |
| JP | 2005-268453 | 9/2005 |

OTHER PUBLICATIONS

Becker et al., Duromer MID Technology for System-in-Package Generation, IEEE Transactions on Electronics Packaging Manufacturing, vol. 28, No. 4, pp. 291-296, 2005.

Chinese Office Action dated Jul. 18, 2008 corresponding to U.S. Appl. No. 12/200,177, filed Aug. 28, 2008.

Taiwanese Office Action for 96109512 mailed on Sep. 28, 2009.

* cited by examiner

FIG. 21A
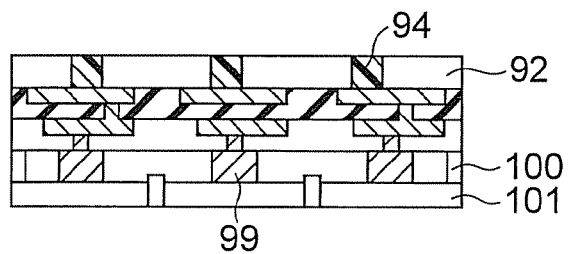
FIG. 21B
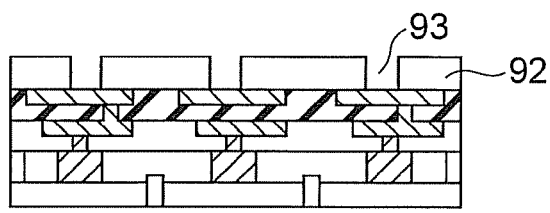
FIG. 21C
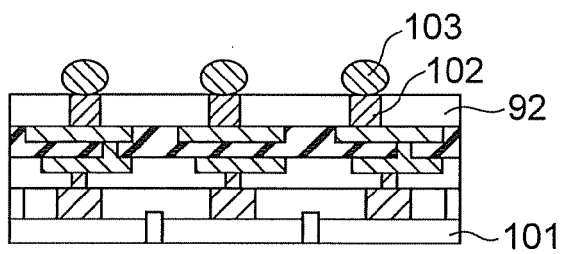
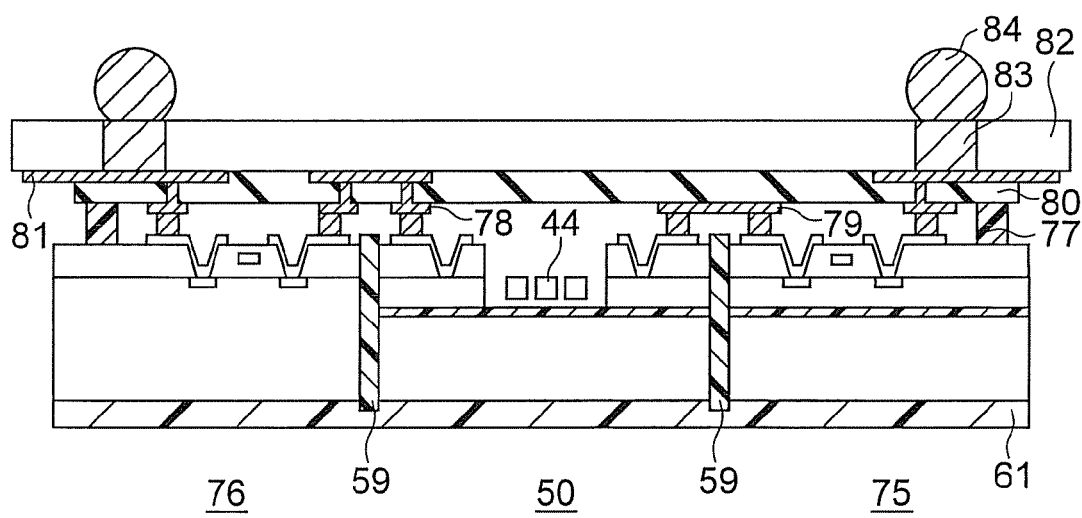
FIG. 22

SEMICONDUCTOR APPARATUS AND METHOD FOR MANUFACTURING THE SAME

CROSS-REFERENCE TO RELATED APPLICATION

This application is based upon and claims the benefit of priority from prior Japanese Patent Application No. 2006-91242 filed on Mar. 29, 2006 in Japan, the entire contents of which are incorporated herein by reference.

This application is a Division of and claims the benefit of priority to co-pending U.S. patent application Ser. No. 11/678,996, filed on Feb. 26, 2007, the entire contents of which are incorporated herein by reference.

BACKGROUND OF THE INVENTION

1. Field of the Invention

The present invention relates to a semiconductor apparatus that includes MEMS (Micro-Electro-Mechanical Systems) device and semiconductor devices, and a method for manufacturing the semiconductor apparatus.

2. Related Art

"MEMS (Micro-Electro-Mechanical Systems)" is a generic term for micro structures manufactured by silicon microfabrication processes. The MEMS are expected to be applied in various fields such as pressure sensors, acceleration sensors, ink jet printers, filters, and the likes. To construct a system with MEMS devices having such MEMS structures, it is necessary to integrate MEMS devices and other semiconductor devices (such as logic circuits, analog amplifiers, and memories) on the same substrate.

There are two methods for integration. One is so-called System-On-Chip (SOC), and all devices are formed directly on one chip, so as to achieve integration. By this method, high device integration can be achieved, and minute global wires that connect the devices can be formed, as all the devices are formed on one chip. Accordingly, higher integration and higher performance can be achieved, and a thinner package can be formed. However, this method has limits on the types of devices that can be integrated. For example, it is difficult to form devices made of a crystalline material such as GaAs on a silicon substrate, because of the differences in lattice constant and thermal expansion rate between silicon and GaAs. Also, devices such as LSIs that require very precise design and device that can be formed by a rough design plan cannot be efficiently produced in one process. Especially, when a new device is incorporated, all the procedures need to be changed. As a result, the costs for new device development become high, and the development period becomes inconveniently long.

The other method is so-called System-In Package (SIP). By this method, chips are formed independently of one another, and are divided and mounted on a substrate called an "interposer". Since the devices can be formed independently of one another, there are fewer limits on the types of devices that can be integrated. Also, when a new system is developed, existing chips can be used. Accordingly, the development costs can be made lower, and the development period can be made shorter. However, by this method, higher density of chips, minute wires, and thinner packages are difficult to achieve, since the interposer and the chips are connected with bonding wires or bumps.

By an example modification of SIP, chips of different kinds that are formed independently of one another are mounted together on the same semiconductor substrate (see JP-A 2001-189424 (KOKAI)). By the technique disclosed in this patent document, a circuit having predetermined functions and one or more concave portions are formed on the semiconductor substrate, and semiconductor chips that are prepared beforehand are embedded in the concave portions. The technique disclosed in JP-A 2001-189424 (KOKAI) has limits on the shapes of the sections of the semiconductor chips, since the semiconductor chips are embedded in the concave portions. For example, it is difficult to embed the semiconductor chip, unless the section of each semiconductor chip is tapered. If the section of each semiconductor chip has a vertical form, it is difficult to embed the semiconductor chips. If the section of each semiconductor chip is reverse-tapered, the semiconductor chips cannot be embedded. This technique is unsuitable especially for complex structures such as MEMS.

By another example modification of SIP, two or more chips of different kinds are temporarily secured on an adhesive material. The chips are embedded by applying an adhesive agent over the chips, and are integrated by removing the adhesive agent (see JP-A 2005-268453 (KOKAI)). By the technique disclosed in JP-A 2005-268453 (KOKAI), the principal face of each chip (the device face) is located on the opposite side from the adhesive material. If chips with different thicknesses are mounted together, the distances from the surface of the adhesive material to the upper faces of the chips vary. As a result, the thickness of the passivation film on the chips varies, and a thicker passivation film is required. In a thick passivation film, it is difficult to form minute through holes.

Under such circumstances, more sophisticated functions, higher integration, lower costs, and thinner packages are also expected for the integration of MEMS devices and semiconductor devices. However, integration of MEMS devices has a few more problems. First of all, the structure of each MEMS device is complicated. Also, each MEMS device to be packaged needs to have a hollow structure. Therefore, it is necessary to form a cap on each MEMS device. The cap needs to have a thickness large enough to endure the hollow structure. For this reason, most MEMS devices are thicker and more complicated in shape than other semiconductor devices. When such devices are integrated, the resultant chip becomes thicker than a conventional chip, and wire connections become difficult.

As described above, when devices of different kinds are integrated by SOC, there are limits on the types of devices that can be integrated, and development costs are high. By SIP, high integration cannot be achieved, and it is difficult to reduce the size of the entire system and to make the package thinner. Particularly, when MEMS devices are integrated, high integration and a thinner package are even more difficult to achieve, because of the large thicknesses and complicated shapes of the MEMS devices.

SUMMARY OF THE INVENTION

The present invention has been made in view of these circumstances, and an object thereof is to provide a semiconductor apparatus that can be highly integrated and thinned, even though MEMS devices and semiconductor devices are contained in the apparatus, and a method for manufacturing such a semiconductor apparatus.

A semiconductor device according to a first aspect of the present invention includes: a first chip including a MEMS device formed therein; a second chip including a semiconductor device formed therein; and an adhesive layer bonding a side face of the first chip to a side face of the second chip, and having a lower Young's modulus than the material of the first and second chips.

A semiconductor device according to a second aspect of the present invention includes: a first chip including a MEMS device formed therein; a second chip including a semiconductor device formed therein; a first adhesive layer bonding a side face of the first chip to a side face of the second chip, and having a lower Young's modulus than the material of the first and second chips; a third chip including a MEMS device formed therein; a fourth chip including a semiconductor device formed therein; and a second adhesive layer bonding a side face of the third chip to a side face of the fourth chip, and having a lower Young's modulus than the material of the third and fourth chips.

A method for manufacturing a semiconductor apparatus according to a third aspect of the present invention includes: forming a plurality of semiconductor devices on a first semiconductor substrate; forming a first protection film that covers the plurality of semiconductor devices; temporarily bonding the first protection film to a first temporary adhesive layer that is formed on a surface of a first substrate that is independent of the first semiconductor substrate; forming a plurality of semiconductor chips by cutting the first semiconductor substrate and dividing the plurality of semiconductor devices; removing one of the semiconductor chips from the first temporary adhesive layer by selectively picking up the one semiconductor chip; temporarily bonding and transferring the picked-up semiconductor chip onto a second adhesive layer that is formed on a surface of a second substrate that is independent of the first substrate; forming a plurality of MEMS devices on a second semiconductor substrate that is independent of the first semiconductor substrate; forming a second protection film that covers the plurality of MEMS devices; temporarily bonding the second protection film to a third temporary adhesive layer that is formed on a surface of a third substrate that is independent of the first substrate and the second substrate; forming a plurality of MEMS chips by cutting the second semiconductor substrate and dividing the plurality of MEMS devices; removing one of the MEMS chips from the third temporary adhesive layer by selectively picking up the one MEMS chip; temporarily bonding and transferring the picked-up MEMS chip onto the second temporary adhesive layer formed on the surface of the second substrate; forming a first adhesive layer so as to cover the MEMS chip and the semiconductor chip and to fill a space between the MEMS chip and the semiconductor chip; making the heights of the MEMS chip and the semiconductor chip equal to each other with respect to the second temporary adhesive layer by polishing the first adhesive layer and polishing at least one of the MEMS chip and the semiconductor chip; and removing the MEMS chip and the semiconductor chip from the second temporary adhesive layer by bonding the MEMS chip and the semiconductor chip to a second adhesive layer that is formed on a supporting substrate.

BRIEF DESCRIPTION OF THE DRAWINGS

FIGS. 21A through 21C are cross-sectional views showing a method for manufacturing a semiconductor apparatus in accordance with the third embodiment;

FIG. 22 is a cross-sectional view showing a semiconductor apparatus in accordance with a modification of the third embodiment;

DETAILED DESCRIPTION OF THE INVENTION

Figure 1A:
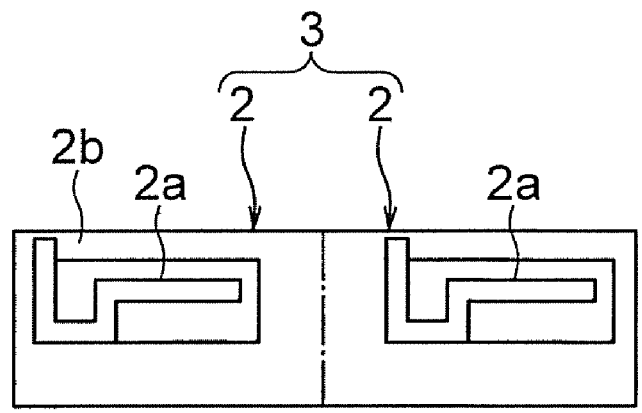
FIGS. 1A through 1C are cross-sectional views showing a method for manufacturing a semiconductor apparatus in accordance with a first embodiment.
Figure 1B:
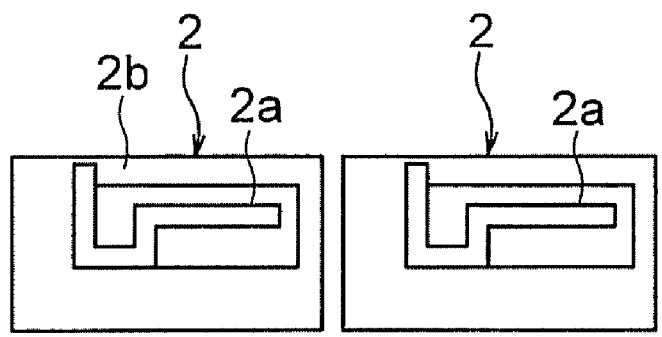
Figure 1C:
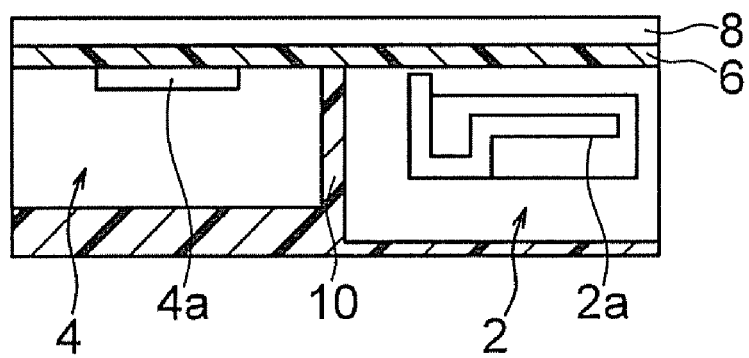

The following is a description of embodiments of the present invention, with reference to the accompanying drawings.

First Embodiment

A method for manufacturing a semiconductor apparatus in accordance with a first embodiment of the present invention is described. Referring first to FIGS. 3(a) through 3(d), the concept of the manufacturing method in accordance with this embodiment is described. Chips of different types such as MEMS chips 20a and 21a and CMOS chips 22a and 23a formed on different wafers 20 and 22 are cut off from the wafers, and those chips are rearranged on a supporting substrate 24 that has an adhesive layer applied thereon (see FIGS. 3(a), 3(b), and 3(c)). An adhesive layer is formed between each two chips, and each two chips are bonded to each other with the supporting substrate 24 and the adhesive layer. Wires 26 are then formed between the chips (see FIG. 3(d)).

FIGS. 1A through 2C illustrate the manufacturing procedures in accordance with the manufacturing method of this embodiment. First, MEMS chips 2 having MEMS devices 2a provided therein are formed on a silicon substrate 3 (see FIG. 1A). Each of the MEMS chips 2 has a cap layer 2b that protects the MEMS device 2a. As shown in FIG. 1B, the MEMS chips 2 are cut away from the silicon substrate 3. Meanwhile, CMOS chips 4 having semiconductor devices such as CMOS devices 4a are formed on a semiconductor substrate (not shown), and the CMOS chips 4 are cut from the semiconductor substrate. As shown in FIG. 1C, each of the CMOS chips 4 and each of the MEMS chips 2 that have already been cut away from the substrate are temporarily attached to a substrate 8 having a temporary adhesive layer 6 formed thereon. An adhesive material is then applied to the opposite face (the bottom faces) of the MEMS chip 2 and the CMOS chip 4 from the substrate 8, so as to form an adhesive layer 10 between the MEMS chip 2 and the CMOS chip 4 (see FIG. 1C).

Figure 2A:
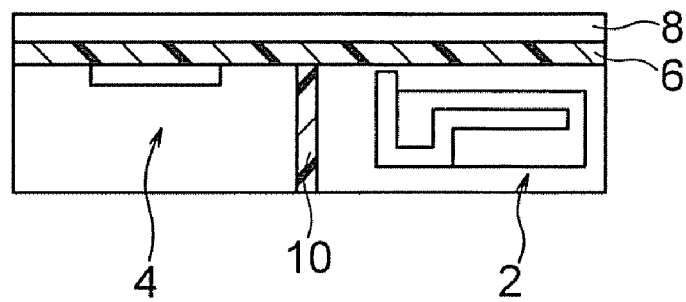
FIGS. 2A through 2C are cross-sectional views showing a method for manufacturing a semiconductor apparatus in accordance with the first embodiment.
Figure 2B:
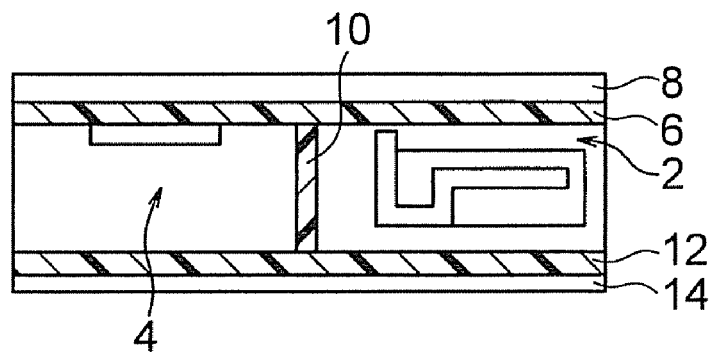
Figure 2C:
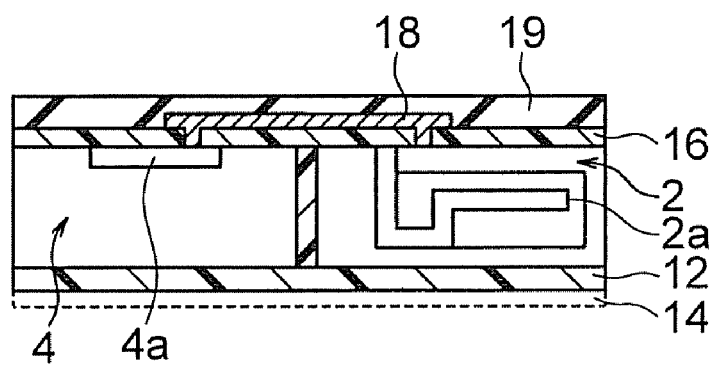
Figure 3:
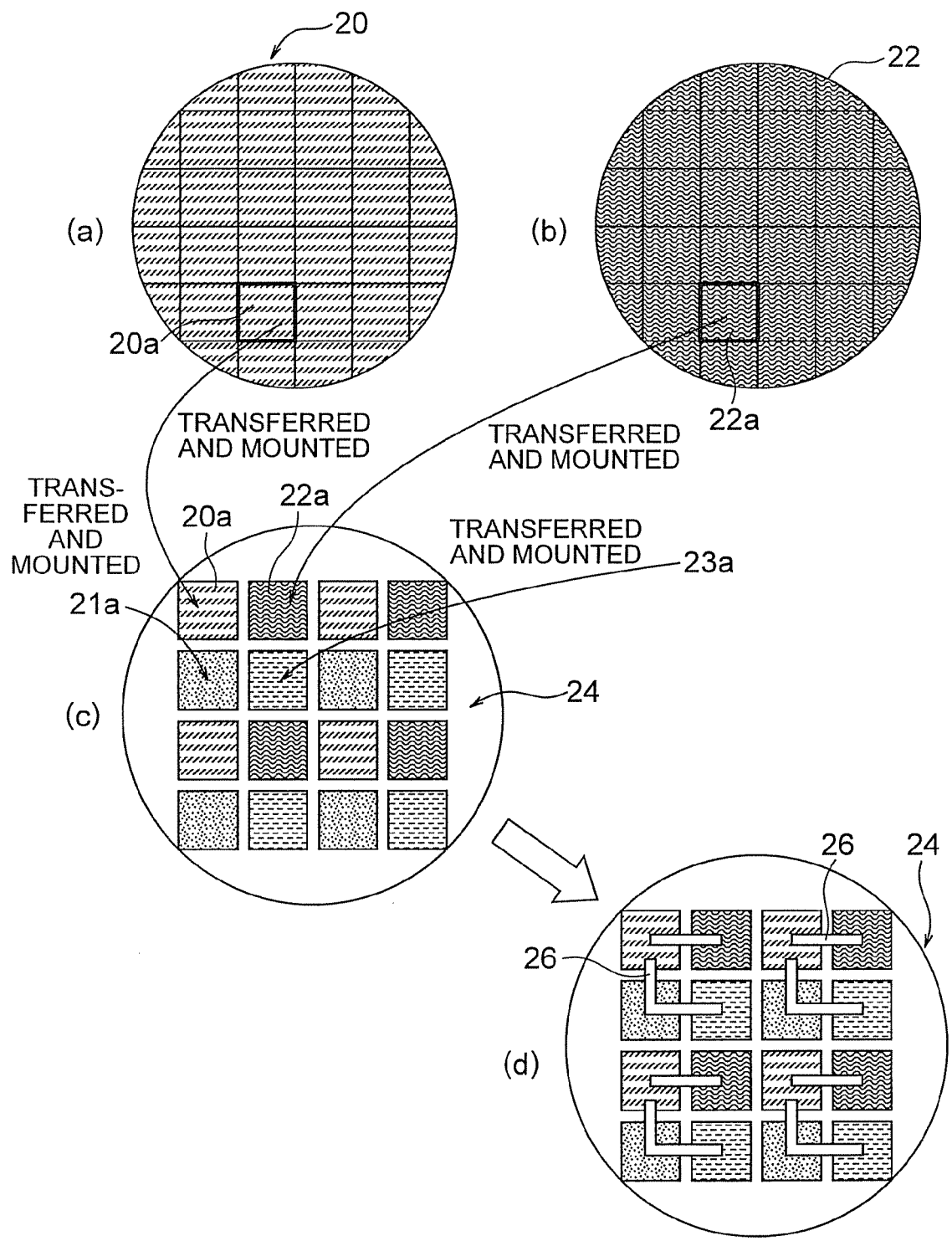
FIGS. 3(a) through 3(d) illustrates the concept of the manufacturing method in accordance with the first embodiment.

As shown in FIG. 2A, the face having the adhesive material applied thereto (the bottom face) is polished and smoothened, so that the MEMS chip 2 and the CMOS 2 chip 4 have the same heights. As shown in FIG. 2B, a supporting substrate 14 having an adhesive layer 12 formed thereon is pressed against and attached to the smoothened bottom face. As shown in FIG. 2C, the temporary adhesive layer 6 and the substrate 8 are removed. An insulating film 16 is then formed on the face (the upper face) from which the temporary layer 6 and the substrate 8 are removed, and holes that connect to the MEMS device 2a and the CMOS device 4a are formed in the insulating film 16. A wiring material film is formed to fill the openings, and patterning is performed on the wiring material film to form a wire 18 that connects the MEMS device 2a and the CMOS device 4a. An insulating film 19 is then formed to cover the wire 18, and, if necessary, the supporting substrate 14 is removed or eliminated (see FIG. 2C).

Figure 33:
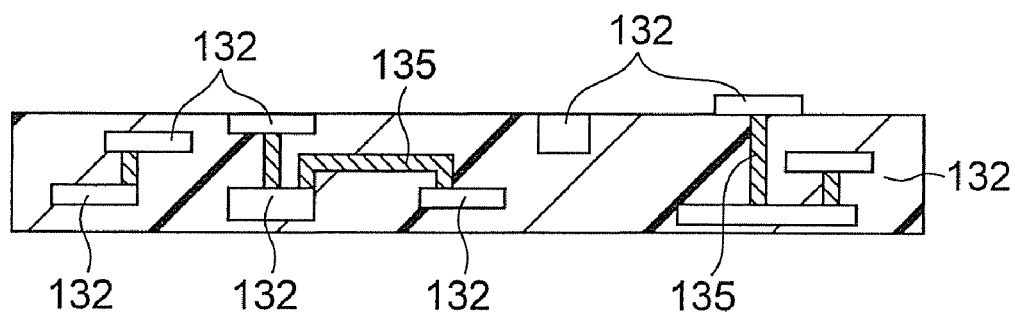
FIG. 33 is a cross-sectional view of a semiconductor apparatus in accordance with a fourth modification of the ninth embodiment.

In the semiconductor apparatus of this embodiment that is formed in the above described manner, the MEMS chip 2 and the CMOS chip 4 have their principal faces (on which the devices are formed) or their bottom surfaces (the surfaces on the opposite side from the principal faces) located substantially on the same planes. This is also the case in the following embodiments, except for the example shown in FIG. 33. The MEMS chip 2 and the CMOS chip 4 have substantially the same heights, except for the insulating film and the wire formed thereon.

As described above, in this embodiment, device chips that have different functions and are formed on different wafers are cut off and rearranged, and are then integrated with an adhesive layer. In this manner, one large bonded chip is formed. A conventional semiconductor process can be applied to this pseudo chip. More specifically, a metal thin film is formed on a pseudo chip by a thin film forming method such as a sputtering method, and resist patterning is performed by a photolithography technique or the like. A wiring pattern is then formed by a dry etching technique or a wet etching technique. With the conventional semiconductor process, more minute wiring, higher integration, and a thinner chip package that are difficult to achieve by the SIP technique but are possible to achieve by the SOC technique can be realized. Also, there are no limits to the kinds of devices that can be integrated, while devices that can be integrated are limited by the SOC technique. Further, the development costs can be made lower than those for the existing chips, and the development periods can be made shorter.

This embodiment also has the following advantages over the technique disclosed in JP-A 2001-189424 (KOKAI), which has been described as a conventional technique. In this embodiment, chips are fixed with an adhesive layer, and accordingly, there are no restrictions on the shapes of the sections of the chips. Even if the section of a chip has a tapered shape or a vertical form, there are no problems. An inverse tapered shape is rather preferred, as each chip can be embedded in the adhesive layer, and can be stably and firmly fixed. Also, in JP-A 2001-189424 (KOKAI), a silicon substrate is used as the substrate. Etching or the like is performed so as to form concavities. Accordingly, the concavities formed in one procedure have uniform depths. In this embodiment, on the other hand, chips with different thicknesses are fixed to the temporary adhesive layer 6 on the upper surface side, and an adhesive material is applied to the bottom face side (and flattening by polishing can be performed as well), so that chips with different thicknesses can be stacked and integrated in one procedure.

This embodiment also has the following advantages over the technique disclosed in JP-A 2005-268453 (KOKAI). In this embodiment, the heights on the device surface side are made uniform with the temporary adhesive layer 6. Accordingly, the thickness of the passivation film formed on the device is minimized, and minute through holes can be formed. Thus, minute wires can be formed.

Figure 4:
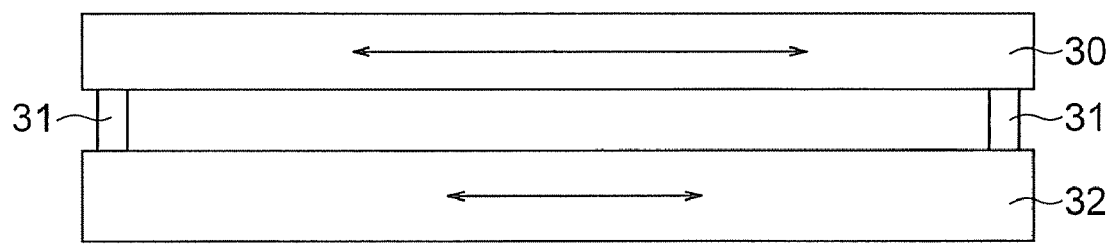
FIG. 4 is a schematic view showing a conventional semiconductor apparatus.
Figure 5:
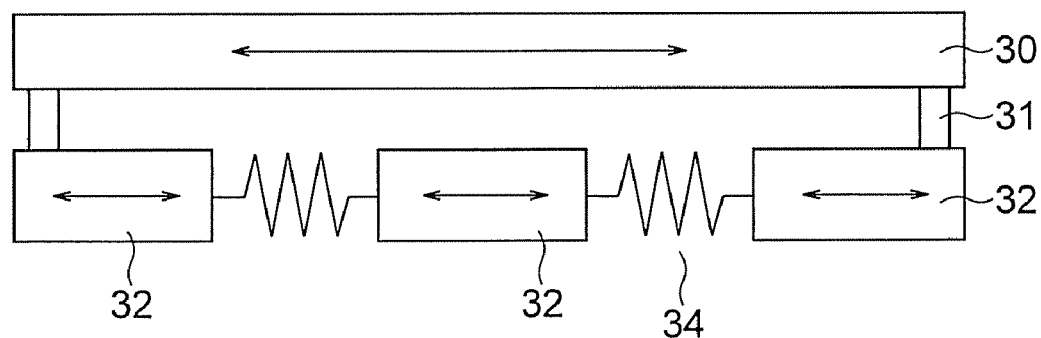
FIG. 5 shows an equivalent structure of a semiconductor apparatus manufactured by the manufacturing method in accordance with the first embodiment.

Unlike the techniques disclosed in JP-A 2001-189424 (KOKAI) and JP-A 2005-268453 (KOKAI), this embodiment integrates chips with an adhesive layer so as to solve the problems of warp and cracks in the substrate due to thermal stress caused in the substrate having a stacked structure. This effect is illustrated in FIGS. 4 and 5. FIG. 4 is a schematic view showing the structure of a semiconductor apparatus that is manufactured by a method disclosed in the above described patent publications. By this method, two substrates 30 and 32 made of materials with different thermal expansion coefficients are bonded to each other with joining portions 31 such as bumps. When heating is performed in this condition, the joining portions 31 such as bumps might be broken, or the substrate 30 or 32 might be broken, due to the different thermal expansion coefficients. This problem can be solved by making the thermal expansion coefficients of the substrates 30 and 32 equal to each other. However, this reduces the degree of freedom in design.

FIG. 5 shows an example structure of a semiconductor apparatus manufactured by the manufacturing method in accordance with this embodiment. In this structure, the substrate 32 is formed with integrated chips that are bonded to each other with an adhesive layer 34. The adhesive layer 34 is made of a soft material, so as to function as springs in an equivalent circuit. Here, the stress caused by the difference in thermal expansion between the substrates 30 and 32 can be absorbed by the adhesive layer 34. The hardness of the adhesive layer 34 should be smaller than the hardness of each of the chips as the components, so as to achieve the desired effect. Quantitatively speaking, the Young's modulus of a silicon chip is 100 GPa to 200 GPa, and therefore, a resin material with a Young's modulus of 10 GPa or less, which is approximately 10% or less of that of a silicon chip, can be effectively used for the adhesive layer 34 to achieve an excellent buffering effect. For example, epoxy resin has a Young's modulus of approximately 8 GPa, which satisfies the above condition, and accordingly, has a sufficient buffering effect. When attached onto a silicon substrate or a glass substrate, adhesive materials such as an acrylic material, a silicone rubber material, and a polyimide material, are found effective. With any of those materials, the stability and the reliability in processing can be increased, without a broken bump or substrate. Accordingly, this embodiment can provide a substrate that is hard to break and has great strength. Also, as the adhesive layers absorb the variation in stress caused by thermal expansion of the substrates in the heating process, warp in the substrates can be prevented. The adhesive layers are preferably made of a soft material that has high adhesive strength, or a material with a low glass transition temperature. More specifically, resin materials such as acrylic resin, epoxy resin, silicone resin, and polyimide resin, are preferred, in view of adhesiveness, stress absorbing properties, and resistance to chemicals. However, other various materials may be employed.

As another measure against cracks due to thermal stress, the thermal expansion coefficients of the stacked substrates are adjusted. In the two-layer stacked device shown in FIG. 5, the first layer is formed with chips bonded to one another with adhesive resin. The length of the ith chip counted from one end is La(i), the thermal expansion coefficient of the ith chip is αa(i), and the number of chips is Na. The length of the ith adhesive layer is Lb(i), the thermal expansion coefficient of the ith adhesive layer is αb(i), and the number of adhesive layers is Nb. The second layer in the two-layer stacked device is formed with one substrate. The length of this substrate is L, and the thermal expansion coefficient of this substrate is α. If the amount of expansion caused by the thermal expansion of the first-layer substrate formed with chips is the same as the amount of expansion of the second-layer substrate, no warp is caused in the stacked device. Therefore, the following equation should be satisfied:

$$L \times \alpha = \sum_{i=1}^{Na} La(i) \times \alpha a(i) + \sum_{i=1}^{Nb} Lb(i) \times \alpha b(i)$$

If the same material is used for the adhesive layers, the thermal expansion coefficients of the adhesive layers should be uniform. With the expression being modified with αb(i)=b, warp caused by the difference in thermal expansion between the stacked substrates can be prevented by adjusting the thermal expansion coefficient of the adhesive layers to the amount represented by the following expression:

$$\alpha b = \frac{L \times \alpha - \sum_{i=1}^{Na} La(i) \times \alpha a(i)}{\sum_{i=1}^{Nb} Lb(i)}$$

As described above, in accordance with this embodiment, a highly integrated, thin apparatus can be obtained, even if the apparatus contains MEMS devices and semiconductor devices.

Second Embodiment

Referring now to FIGS. 6A through 15B, a method for manufacturing a semiconductor apparatus in accordance with a second embodiment of the present invention is described. This embodiment involves integration of MEMS device chips and LSI chips formed with CMOS circuits. FIGS. 6A through 15B are cross-sectional views showing the procedures for manufacturing the semiconductor apparatus in accordance with this embodiment.

Formation of MEMS Chips

Figure 6A:
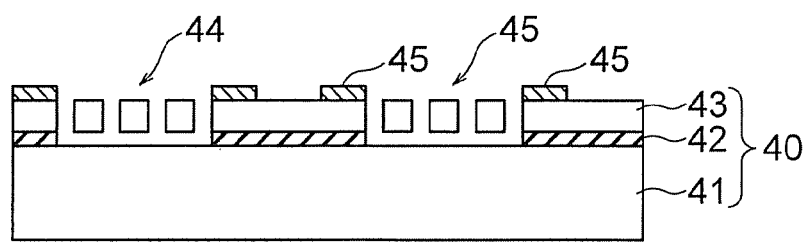
FIGS. 6A through 6B are cross-sectional views showing a method for manufacturing a semiconductor apparatus in accordance with a second embodiment.

First, chips to be integrated are produced. Here, MEMS chips are to be produced. As shown in FIG. 6A, a SOI substrate 40 that includes a supporting substrate 41, an embedded insulating film 42 provided over the supporting substrate 41, and a SOI layer 43 provided over the embedded insulating film 42 is prepared. A metal layer 45 made of Al or the like is then formed over the SOI substrate 40. A resist pattern (not shown) made of photoresist is formed on the metal layer 45. With this resist pattern serving as a mask, patterning is performed on the metal layer 45, using an etchant made of a mixed solution of phosphoric acid, acetic acid, and nitric acid. The resist pattern is then removed. Another resist pattern (not shown) is formed on the SOI layer 43. With this resist pattern serving as a mask, etching is performed on the SOI layer 43 by RIE until the embedded insulating film 42 is exposed. After etching using a chemical solution of fluoric acid or the like is performed on the SOI layer 43, the resist pattern is removed. In this manner, the basic structure of each MEMS device 44 is formed. The performance of each MEMS device 44 is examined to detect defective portions.

Figure 6B:
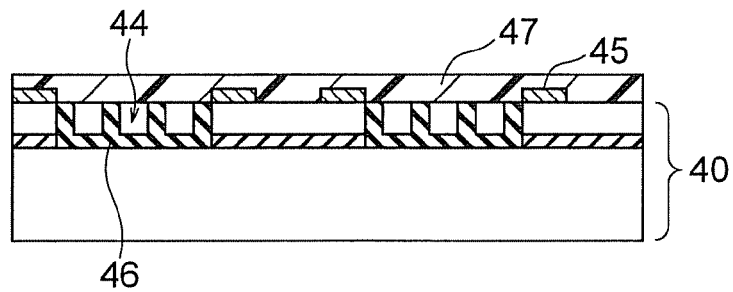

After the examination, protection layers are formed. As shown in FIG. 6B, a MEMS protection layer 46 to cover the void in the MEMS device 44 is formed. A protection layer 47 to protect the entire MEMS device 44 is then formed. The MEMS protection layer 46 and the protection layer 47 need to be made of different types of material or the same material in different states. In this example, the protection layer 47 is made of positive photoresist, and the MEMS protection layer 46 is made of SiOx of a coating type.

Figure 7A:
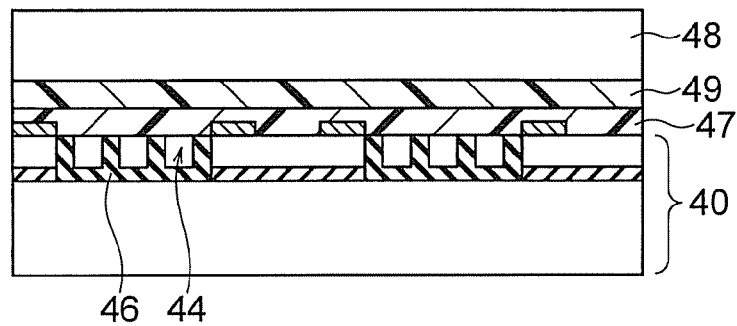
FIGS. 7A through 7B are cross-sectional views showing a method for manufacturing a semiconductor apparatus in accordance with the second embodiment.
Figure 7B:
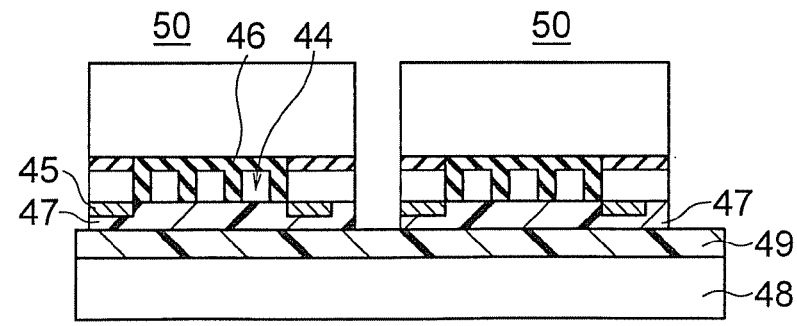

As shown in FIG. 7A, a substrate 48 is prepared, and a temporary adhesive layer 49 is formed on this substrate 48. In this example, the temporary adhesive layer 49 is coated with a weak adhesive agent having very small adhesion. The face of the substrate 48 having the temporary adhesive layer 49 formed thereon is pressed against the protection layer 47, so that the protection layer 47 is temporarily bonded to the temporary adhesive layer 49.

With the substrate 48 being in a temporarily bonded state, the SOI substrate 40 and the substrate 48 are put upside down. The SOI substrate 40 on the temporary adhesive layer 49 is divided so as to form MEMS chips 50 (see FIG. 7B). The dividing is normally performed by a technique using a dicer, but it is possible to use a laser or water jet, so as to reduce the amount of wastes and make the end faces smoother. Alternatively, with a resist pattern formed by a photolithography technique using a dry etcher such as the DRIE technique, etching and patterning may be performed on the divided portions of the chips. By doing so, the amount of wastes can be reduced, and the end faces of the chips can be made very smooth.

Formation of CMOS Chips

Likewise, CMOS chips are formed. The structure of each CMOS chip is not shown in the drawings. First, the surface of a p-type silicon substrate is baked through oxidization, and a silicon oxide layer is formed on the surface. A resist pattern made of photoresist is formed on the silicon oxide layer. With this resist pattern serving as a mask, ion implantation with donor impurities (such as phosphorus ions) is performed, so as to form an n-well layer on the p-type silicon substrate. The resist pattern is then removed.

Next, a SiNx layer is formed by CVD or the like. A resist pattern is formed on the SiNx layer. With this resist pattern serving as a mask, etching is performed on the SiNx layer by RIE or the like, so as to form grooves around the n-well region. The resist pattern is then removed.

A SiOx layer is then formed on the entire surface of the substrate by CVD or the like, so as to fill the grooves. The SiOx layer is smoothened by CMP or the like. The SiNx layer and the SiOx layer covering the n-well region and the p-type silicon substrate are then removed. As a result, device separating regions made of SiOx are formed around the n-well region, and the n-well region is separated from other devices. Baking is then performed in the existence of oxygen, so that a gate insulating film made of SiOx is formed on the surfaces of the n-well region and the p-type silicon substrate.

Next, a polysilicon film is formed on the gate insulating film by CVD or the like. A resist pattern made of photoresist is formed on the polysilicon film. With this resist pattern serving as a mask, etching is performed on the polysilicon film and the gate insulating film, so as to form a gate electrode made of polysilicon. The resist pattern is then removed.

Next, a resist pattern is formed to cover only the n-well region. With this resist pattern and the gate electrode serving as a mask, n-type dopants such as As ions are implanted into the p-type silicon substrate at both sides of the gate electrode, so as to form an n-type extension layer. After the resist pattern is removed, a resist pattern that exposes only the n-well region is formed. With this resist pattern and the gate electrode serving as a mask, p-type dopants such as boron ions are implanted, so as to form a p-type extension layer on the n-well region at both sides of the gate electrode.

After the resist pattern is removed, a SiOx film is formed on the entire surface, and anisotropic etching is performed on the SiOx film by RIE or the like. As a result, a gate sidewall made of SiOx is formed on the side portions of the gate electrode.

Next, a photoresist pattern is formed so as to cover only the n-well region, and ions are implanted into the p-type substrate at both sides of the gate electrode, so as to form an n-type source and drain. After the resist pattern is removed, a resist pattern that exposes only the n-well region is formed, and boron ions are implanted into the n-well region at both sides of the gate electrode, so as to form a p-type source and drain.

A metal thin film made of a refractory metal such as Ti, W, or Ta is formed by a sputtering technique or the like. A heating treatment is then carried out so as to form a silicide layer on the silicon surface. The metal not to be silicided is removed by etching.

Next, an interlayer insulating film made of SiOx or the like is formed, and a resist pattern is formed on the interlayer insulating film. With this resist pattern serving as a mask, etching is performed so as to form contact holes. After the resist pattern is removed, an aluminum film is formed on the entire surface so as to fill the contact holes. Patterning is performed on the aluminum film, so as to form electrode pads.

Like the MEMS chips, the CMOS device formed in the above described manner is divided by a dicing technique, a laser-cut technique, or an etching technique, into chips.

Transfer

Figure 8A:
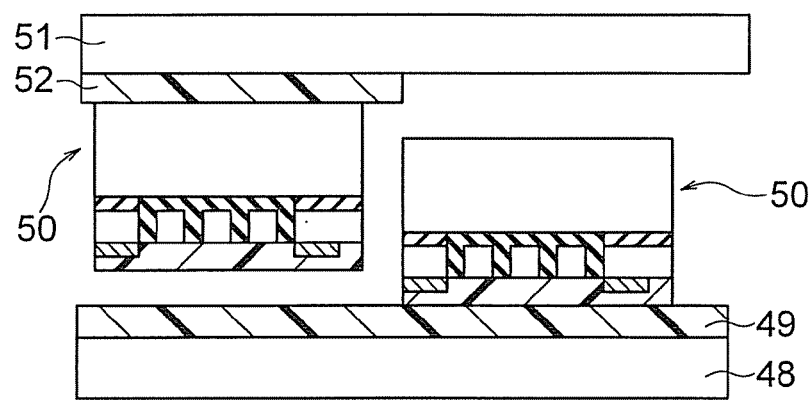
FIGS. 8A through 8B are cross-sectional views showing a method for manufacturing a semiconductor apparatus in accordance with the second embodiment.

Next, a substrate 51 is prepared as shown in FIG. 8A. A pickup mechanism that has temporary adhesive properties is provided only on a part of the substrate 51. For example, an adhesive agent having temporary adhesive properties is patterned in an island shape, so as to form a temporary adhesive layer 52. This temporary adhesive layer 52 patterned in an island shape is pressed against a desired MEMS chip 50, and is then removed from the substrate 48. As a result, only the desired MEMS chip 50 is picked up.

Figure 8B:
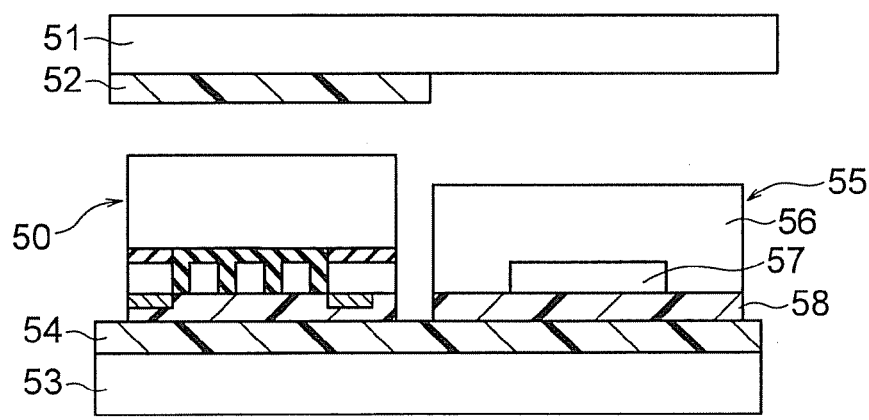

Next, a substrate 53 is prepared as shown in FIG. 8B. A temporary adhesive layer 54 is also formed on the substrate 53. The picked-up MEMS chip 50 is bonded and transferred onto the temporary adhesive layer 54. In FIG. 8B, a CMOS chip 55 is transferred onto the temporary adhesive layer 54 of the substrate 53. This CMOS chip 55 includes a CMOS device 57 formed on a silicon substrate 56 and a protection film 58 to cover the CMOS device 57. The CMOS device 57 is formed in the above described manner.

Thus, the chips 50 and 55 of different types can be mounted together. To mount different chips together, transfer should be performed first for the thinner chip. If transfer is performed first for the thicker chip first, there is a high probability that a defect is caused as the chip already transferred is brought into contact with the substrate 51. Such a defect can be prevented by increasing the thickness of the temporary adhesive layer 52, or forming a notch in the lower substrate 51 so as to increase the thickness of the entire convexity of the picked-up portion. Sometimes, there are some remnants of the adhesive agent at the time of the pickup, but this can be prevented by forming a protection layer on the surfaces of the chips and removing the protection layer after the chips are transferred.

With the use of the temporary adhesive layer 52, a chip of 100 µm or thinner can be picked up, without being damaged. A vacuum chuck may be of course used for the pickup. In such a case, the selective ratio of the chip absorbing force to the chip releasing force can be made higher than that in the case with an adhesive agent, and the chip pickup can be carried out with higher precision. Also, the problem of the remnants of the adhesive agent is not caused with a vacuum chuck. However, the diameter of each suction hole is made as small as ¼ or less of the chip size (X- and Y-direction), the warp of each chip can be dramatically reduced. For example, a silicon chip that is 100 µm thick and 500 µm long in each side can be always successfully absorbed by a pickup mechanism that has 2×2 suction holes of 80 µm in diameter.

Smoothening, Attachment, and Transfer of Chips

As shown in FIG. 8B, the chips 50 and 55 with different thicknesses are formed on the temporary adhesive layer 54. Therefore, an interchip adhesive layer 59 that also serves as a smoothening layer is formed so as to cover the chips 50 and 55. In this embodiment, epoxy resin is applied as the interchip adhesive layer 59 by a printing technique, and is prebaked in the atmosphere in an oven. Here, the thickness of each MEMS chip 50 is approximately 650 µm, and the thickness of each CMOS chip 55 is approximately 625 µm. The adhesive layer 59 is designed to have a total thickness of 700 µm. The printing is performed in a vacuum chamber, so as to form a film in a foamless state.

The correlation between the film thickness of the adhesive layer 59 and the warp of the substrate 53 was examined to find that the warp of the substrate 53 due to thermal shrinkage of the resin was smaller as the adhesive layer 59 was thinner. In this embodiment, the adhesive layer 59 is designed to have a thickness of approximately 75 µm on the bottom face (the upper face in FIG. 9A) of the CMOS chip 55 and a thickness of approximately 50 µm on the back face (the upper face in FIG. 9A) of the MEMS chip 50. With those thicknesses, the warp of the substrate 53 is reasonably small, and the substrate 53 can be introduced into an apparatus such as a film forming apparatus or an exposure apparatus in the later procedures without any problem. However, if the warp is large, there is a need to reduce the warp. To reduce the warp, hot pressing is performed with a hot press machine. The temperature is increased to the glass transition temperature of the adhesive layer 59 or higher, so that the adhesive layer 59 is softened and can be flexibly bent. In this manner, the warp can be reduced. The pressing force should be approximately 10 kN for the substrate 53 of five inches in diameter. In this manner, the warp can be effectively reduced. To increase the adhesion between the press machine and the sample, a spacer made of silicone rubber or the like is inserted, so that the hot pressing is uniformly performed. Thus, the warp is reduced, and the smoothness and the flatness of the substrate surface can be increased. Also, a film or the like that is made of polyimide or Teflon with excellent releasing properties is inserted between the spacer and the sample, so that bonding between the chip surface and the spacer is prevented and the flatness of the sample surface is increased.

Figure 9A:
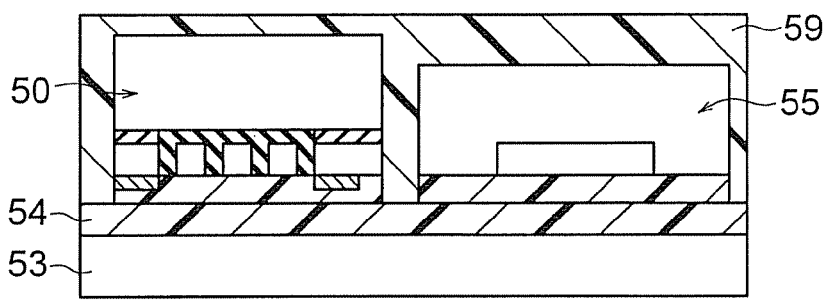
FIGS. 9A through 9B are cross-sectional views showing a method for manufacturing a semiconductor apparatus in accordance with the second embodiment.
Figure 9B:
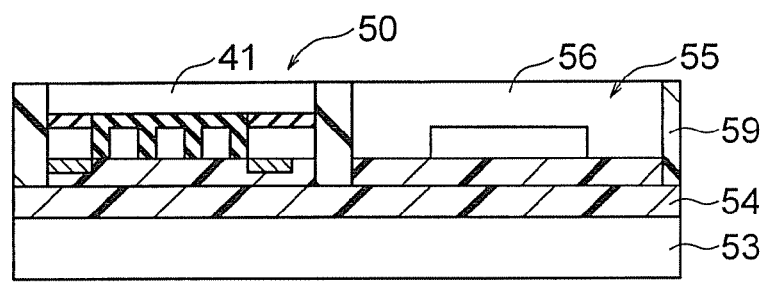

Next, to flatten the bottom face (the upper face in FIG. 9A), the adhesive layer 59, the supporting substrate 41 of each MEMS chip, and the silicon substrate 56 of each CMOS chip are polished by CMP (Chemical Mechanical Polishing) or the like, and the chip thickness is reduced to approximately 100 µm (see FIG. 9B).

Figure 10:
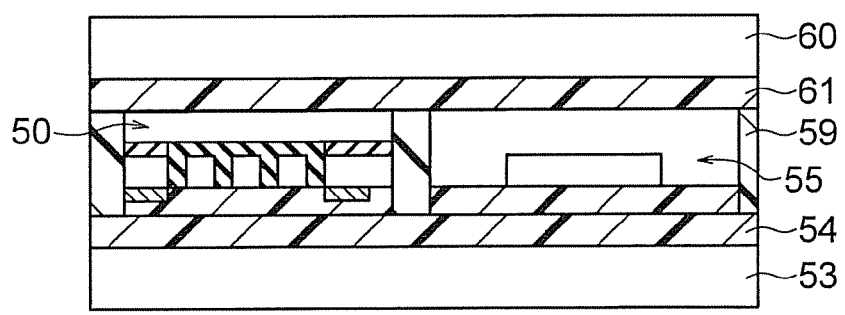
FIG. 10 is a cross-sectional view showing a method for manufacturing a semiconductor apparatus in accordance with the second embodiment.

A substrate that has an adhesive layer 61 formed on a supporting substrate 60 is then prepared as shown in FIG. 10. The adhesive layer 61 is bonded to the MEMS chip 50 and the CMOS chip 55 that are thinned and flattened. In this embodiment, a polyimide thin film is used as the adhesive layer 61. The film thickness of the adhesive layer 61 is approximately 5 µm. A glass substrate is used as the supporting substrate 60. Other than polyimide, some other adhesive agent such as epoxy resin or acrylic resin may be used as the adhesive layer 61. In a case where epoxy resin is employed, a sufficiently strong structure that also serves as a substrate without the supporting substrate 60 is obtained. Especially, in a case where epoxy resin is employed as the interchip adhesive layer 59, the chips can be firmly held only by the interchip adhesive layer 59, and accordingly, the adhesive layer 61 and the supporting substrate 60 are not necessary to hold the chips. However, with a material having a low glass transition temperature, the supporting substrate 60 and the adhesive layer 61 effectively hold the chips, because the substrates might be deformed when the heating temperature during the process becomes equal to or higher than the glass transition temperature.

Figure 11A:
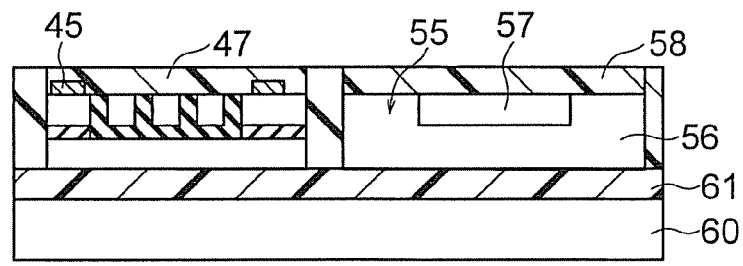
FIGS. 11A through 11B are cross-sectional views showing a method for manufacturing a semiconductor apparatus in accordance with the second embodiment.

The temporary adhesive layer 54 and the substrate 53 are then removed, as shown in FIG. 11A. At this stage, the adhesive layer 59 is substantially embedded between the chips 50 and 55, but the thickness of the step formed between the adhesive layer 59 and the chips 50 and 55 is 5 µm to 10 µm. To eliminate the step, flattening is performed. More specifically, with a spacer being interposed between the integrated substrates of the chips, pressing and heating are performed with a hot press machine over a certain period of time. The resin of the adhesive layer 59 is heated to a temperature equal to or higher than the glass transition temperature of the resin. As a result, the resin is softened and then pressed, so that the thickness of the step on the surface is reduced to 1 µm or less. Here, hot pressing with 10 kN is performed at 80° C. for one hour for the adhesive resin having a glass transition temperature of 55° C. The adhesive resin in a pressed state is then cooled to room temperature. A heat-resisting rubber is used as the spacer, but the material is not limited to that as long as it excels in shock-absorbing properties. However, to prevent bonding between the adhesive resin and the spacer, a film is inserted between the heat-resisting spacer and the sample. Here, the spacer is formed with a polyimide sheet or a Teflon sheet. Since the flatness and smoothness of the film in contact with the surface of the adhesive layer are transferred onto the surface of the adhesive layer, it is necessary to perform hot pressing through a reasonably smooth, flat film. Instead of heating the adhesive layer to the glass transition temperature of higher, a chemical solution such as an acetone solution may be instilled into the adhesive resin, so that the adhesive resin can be softened and is then pressed and molded. In such a case, there is no need to heat the adhesive resin, and accordingly, processing can be performed at a low temperature. The prevention of warp due to the hot pressing may not be carried out in this procedure but may be carried out in any other procedure after the formation of the adhesive resin. Accordingly, in a case where the substrate is warped due to the heating process and cannot be introduced into the apparatus, or where processing cannot be performed, the hot pressing process can be carried out. Lastly, baking is performed to harden the adhesive layer 59. Hot pressing is then performed with a hot press machine and the same spacer as above. Here, heating and pressing are performed at 150° C. for four to five hours, with the pressure being 10 kgf/cm$^2$. The adhesive layer 59 in a pressed state is then cooled to room temperature. In this manner, the size of the warp is sufficiently reduced, and the substrate can be introduced into the processing apparatus used in the later stages.

Figure 11B:
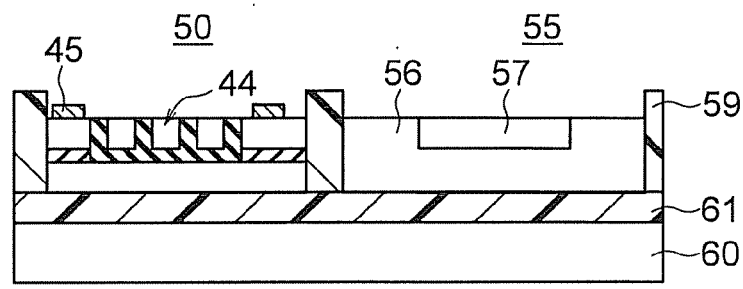

Next, the photoresist forming the surface protection layers 47 and 58 of the MEMS chip 50 and the CMOS chip 55 is removed with acetone, as shown in FIG. 11B. Through the procedures described so far, a pseudo MEMS wafer having the respective chips integrated with the adhesive layers 59 and 61 is formed. This pseudo wafer has substantially the same form as a wafer, and a thin film pattern can be formed on the pseudo wafer by CVD or a sputtering technique.

The ultimate purpose of the provision of the adhesive layers 59 and 61 is to bond and integrate different chips so as to form a pseudo wafer. Any type of resin can absorb the thermal stress generated when thermal expansion is caused in the substrate, and effectively reduce the size of warp caused in the substrate. In this example, epoxy resin is used as the material of the adhesive layers 59 and 61. However, other various resin materials such as silicone resin and polyimide resin may be used.

Epoxy resin can firmly hold the chips. Also, the use of epoxy resin can increase the chemical resistance against alkaline solutions, acid solutions, and organic solvents that are used as a developing solution, an etching solution, a washing solution, and the likes. Especially, an epoxy resin material having a low glass transition temperature overtly exhibits such characteristics. With the use of silicone resin, a structure that has excellent flexibility and has hard adhesive resin to crack can be obtained. With the use of polyimide resin, a structure that is resistant to a temperature as high as 300° C. to 400° C. can be obtained. This structure has the advantage of having fewer limits on the processing temperatures in the later processes.

Formation of Global Multi Wiring Layer

Figure 12A:
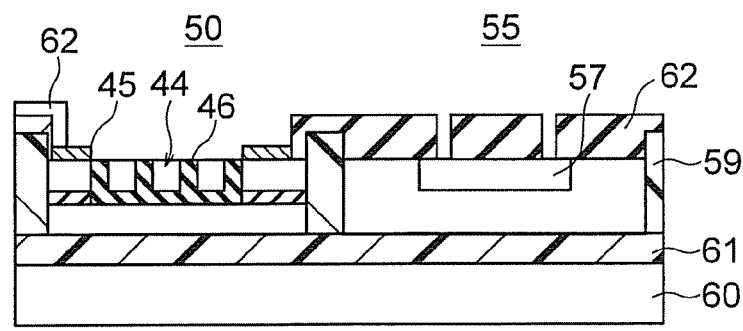
FIGS. 12A through 12B are cross-sectional views showing a method for manufacturing a semiconductor apparatus in accordance with the second embodiment.

Next, a multi wiring layer or a global wiring layer for the respective chips is formed. First, preprocessing is performed, and an insulating layer 62 as a flattening layer is formed as shown in FIG. 12A. As the preprocessing, the surface is thoroughly scrubbed with a neutral detergent, a treatment with a mixture of sulfuric acid and hydrogen peroxide is carried out, and lastly, a diluted hydrofluoric acid treatment is carried out. As a result, the amount of contamination such as remnants of adhesive layers on the surface can be reduced. An O$_2$ plasma treatment is also effective to clean the surface. The flattening layer 62 is then formed. In this embodiment, a polyimide layer of 30 μm is formed as the flattening layer 62. The portions of the flattening layer 62 located above the MEMS devices 44 and the portions equivalent to the contact holes connecting to the CMOS device 57 are removed by an etching technique or the like. Flattening is then performed to completely eliminate the step portions of the flattening layer 62 that are located between the adhesive layer 59 and the chips. Here, polishing and flattening are performed by chemical mechanical polishing (CMP) until the film thickness of the flattening layer 62 made of polyimide becomes approximately 4 μm.

Figure 12B:
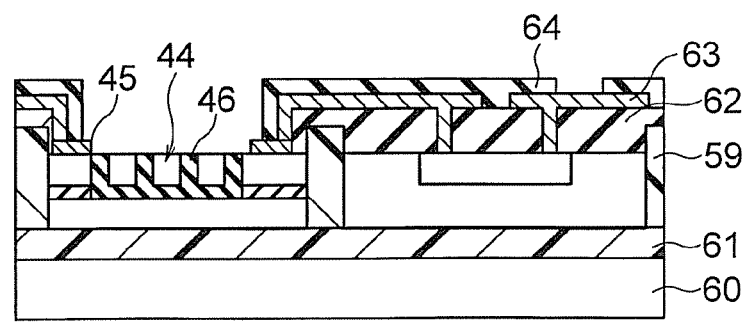

Next, a metal layer made of aluminum and molybdenum is formed to fill the contact holes, as shown in FIG. 12B. A resist pattern (not shown) is formed on the metal layer. With this resist pattern serving as a mask, etching is performed on the metal layer, and the resist pattern is removed. In this manner, a global wiring layer 63 is formed. Although a single-layer structure including the wiring layer 63 and the flattening layer (insulating layer) 62 is formed in this example, insulating layers and wiring layers can be successively stacked, so as to form a multi wiring layer. After the formation of the wiring layer 63, a passivation film 64 made of SOG (Spin-On-Glass) or the like is formed (see FIG. 12B). In FIG. 12B, the passivation film 64 is patterned, so that the portions of the passivation film 64 that are located above the MEMS devices 44 and correspond to the contact holes connecting to the wiring layer 63 of the CMOS chip 55 are removed. However, it is more preferable that the patterning of the passivation film 64 is not performed in this procedure but is performed in a later procedure (the procedure illustrated in FIG. 14A). As the patterning is performed in the later procedure, remnants of a temporary adhesive layer used in the following procedure are prevented from staying in the openings.

As for the wiring formation, the width of only the portion of the wire above the adhesive layers is increased to effectively reduce the burnout rate of the wire. Also, the film thickness of the wire only above the adhesive layers can be increased to effectively reduce the burnout rate. It is also effective to change the wiring material. For example, a material that has a thermal expansion rate closer to that of the adhesive layers or a material that is softer is used above the adhesive layer, so as to reduce the burnout rate of the wire above the adhesive layer. More specifically, a metal material that has high conductivity and softness, such as Au, Ag, Cu, or Al, should be used. Also, an organic semiconductor or conductor such as conductive polymers may be used so as to reduce the difference in thermal expansion between organic materials and to increase the resistance to damage such as cracks. One wire may be divided into several wires above the adhesive layer. As in the case where the wire width is increased, the burnout rate can be effectively reduced. Also, redundancy is obtained, and accordingly, the production yield is increased.

Thinning (Removal) of Supporting Substrate

Figure 13A:
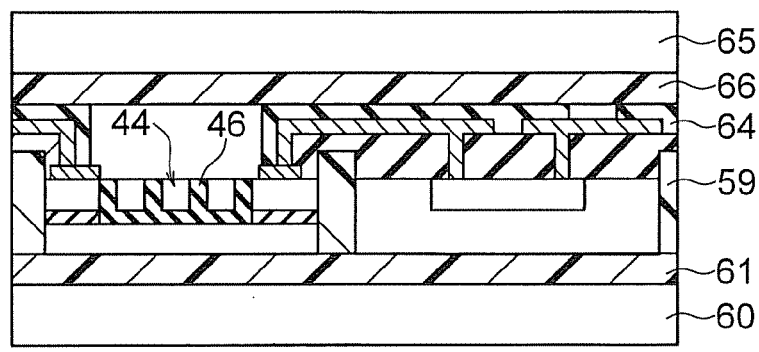
FIGS. 13A through 13B are cross-sectional views showing a method for manufacturing a semiconductor apparatus in accordance with the second embodiment.
Figure 13B:
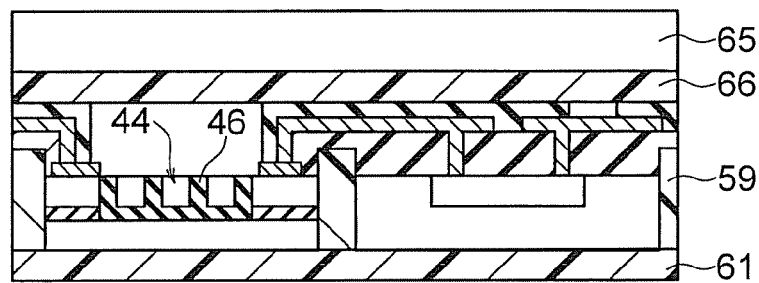

Next, a temporary adhesive layer 66 formed on a substrate 65 is bonded to the upper face of the device or to the passivation film 64, as shown in FIG. 13A. In this situation, the supporting substrate 60 is thinned or removed or isolated, as shown in FIG. 13B. For example, polishing may be performed by CMP or the like, or etching may be performed using a HF solution. Alternatively, a removal layer is formed between the supporting substrate 60 and the adhesive layer 61, and only the removal layer is removed so as to separate the supporting substrate 60 from the adhesive layer 61. In this embodiment, the supporting substrate 60 is made of glass, and a HF etchant is used to etch the supporting substrate 60. In a case where the adhesive layer 61 is made of polyimide, the adhesive layer 61 serves as a stopper layer against hydrofluoric acid, and the glass substrate 60 can be completely removed.

As described above, if the supporting substrate 60 and the adhesive layer 61 are not formed, the step of thinning the supporting substrate 60 is not necessary. For example, in a case where epoxy resin is employed, the chips can be firmly held only by the resin, and there is no need to prepare a supporting substrate. However, in a case where a resin material having a low glass transition temperature, the substrate might be warped during the heating process. To prevent this, a resin material can be effectively bonded temporarily onto the supporting substrate 60. In such a case, an adhesive layer or the like is formed on the supporting substrate 60, so as to temporarily hold the chips during the process. The adhesive layer is removed after the process.

Removal of MEMS Protection Layer, Formation of Cap

Figure 14A:
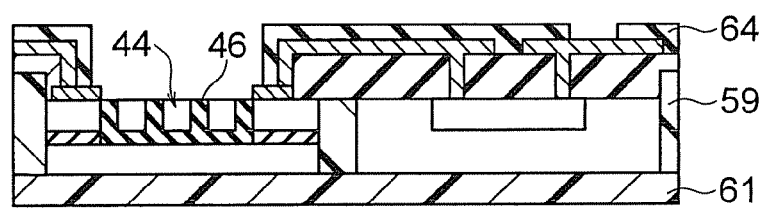
FIGS. 14A through 14B are cross-sectional views showing a method for manufacturing a semiconductor apparatus in accordance with the second embodiment.
Figure 14B:
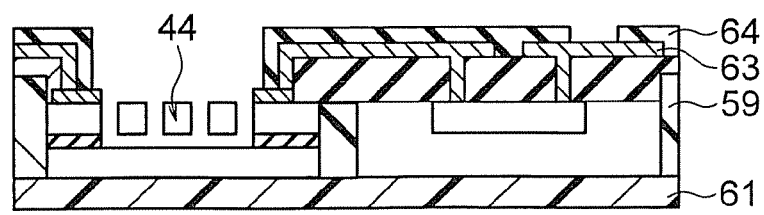

Next, the temporary adhesive layer 66 is removed, as shown in FIG. 14A. After that, the patterning of the passivation film 64 shown in FIG. 12B may be performed. The MEMS protection film 46 is then removed, as shown in FIG. 14B.

Figure 15A:
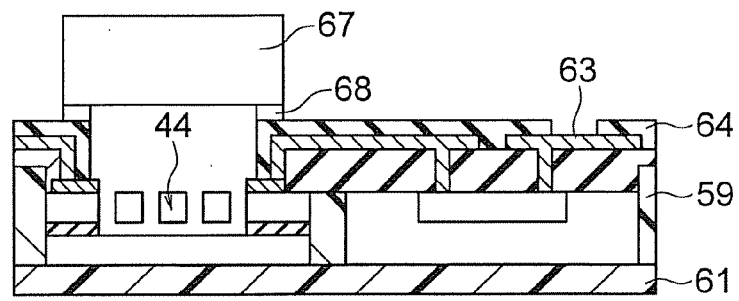
FIGS. 15A through 15B are cross-sectional views showing a method for manufacturing a semiconductor apparatus in accordance with the second embodiment.

A cap layer 67 for the MEMS devices 44 is then formed as shown in FIG. 15A. This cap layer 67 is formed in the following manner. First, a silicon substrate is prepared, and a resist pattern is formed on the surface of the silicon substrate. Etching is performed on the silicon layer, so as to form a concave layer of several microns. The resist pattern is then removed. The bottom face of the silicon substrate is polished so that the silicon substrate is thinned to a thickness between 20 μm and 100 μm. The thinned silicon substrate to be a cap layer and a MEMS SOI substrate are bonded to each other with an adhesive material 68 such as frit glass. Thus, the cap layer 67 is formed. The MEMS devices 44 are sealed with the cap layer 67.

Formation of Bumps

Figure 15B:
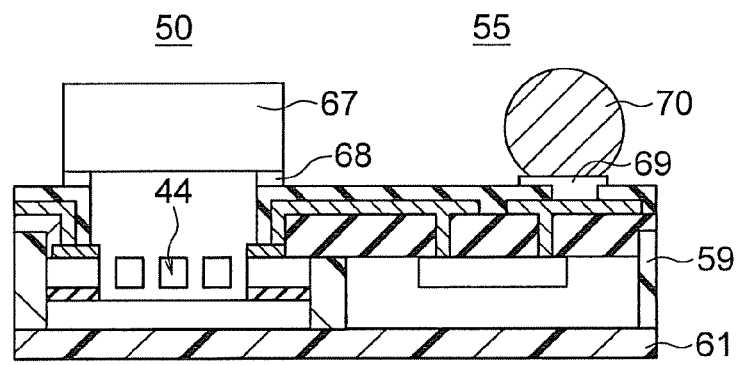

Next, a copper layer is formed by a plating technique or the like, and a Ni layer is formed on the copper layer by a plating technique or the like. A resist pattern is formed on the Ni layer. With this resist pattern serving as a mask, patterning is performed on the Ni layer and the copper layer, so as to form an electrode pad 69, as shown in FIG. 15B. A soldering bump layer 70 is then formed on the electrode pad 69 by a printing technique or the like. More specifically, after an island pattern with soldering paste is formed on the electrode pad 69 through squeegee, a reflow process is carried out to form the ball-like bump layer 70.

The semiconductor apparatus of this embodiment formed in the above described manner can be highly integrated and thinned, even though MEMS devices and semiconductor devices are provided in the apparatus.

Figure 16:
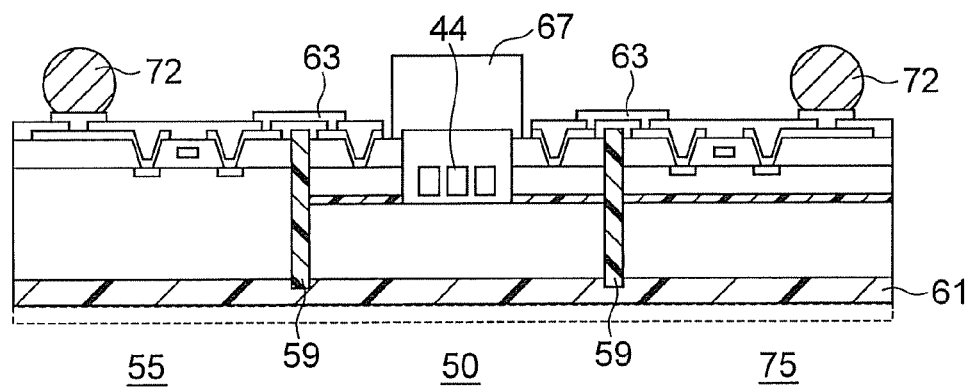
FIG. 16 is a cross-sectional view showing a semiconductor apparatus in accordance with a modification of the second embodiment.

In this embodiment, the MEMS chip 50 formed on a SOI substrate and the CMOS chip 55 formed on a silicon substrate are bonded to each other with the adhesive layer 59 and the adhesive layer 61. However, as in a modification of this embodiment illustrated in FIG. 16, the MEMS chip 50 formed on a SOI substrate, the CMOS chip 55 formed on a silicon substrate, and a SOI chip 75 that is formed on a SOI substrate and has a bump 72 may be bonded to one another with the adhesive layer 59 and the adhesive layer 61. Like the apparatus of the second embodiment, the apparatus of this modification can be highly integrated and thinned, even though MEMS devices and semiconductor devices are provided in the apparatus.

Third Embodiment

Figure 17:
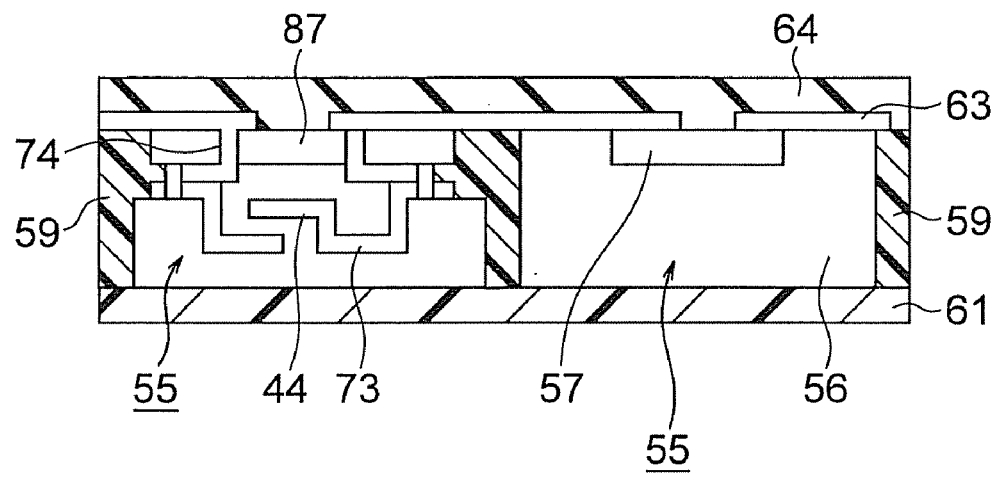
FIG. 17 is a cross-sectional view showing a semiconductor apparatus in accordance with a third embodiment.

FIG. 17 illustrates a semiconductor apparatus in accordance with a third embodiment of the present invention. The semiconductor apparatus of this embodiment is formed by integrating MEMS chips 50 and CMOS chips 55 with an adhesive layer 59 and an adhesive layer 61. This embodiment is characterized in that flattening is performed also on a cap layer 87 for MEMS devices 44, and a wire 73 for the MEMS devices 44 is connected to an external wire 63 outside the MEMS devices 44 through a via layer 74 in the cap layer 87. With this structure, a flat, thin pseudo wafer that includes MEMS devices and has high flexibility can be obtained. The same procedures as those in the first embodiment can be carried out. The cap layer 87 is formed at the time of the formation of the MEMS chip 50. Flattening of the entire surface is performed when the step portions between the different chips are eliminated.

Like the apparatus of the second embodiment, the apparatus of this embodiment can be highly integrated and thinned, even though MEMS devices and semiconductor devices are provided in the apparatus.

Figure 18A:
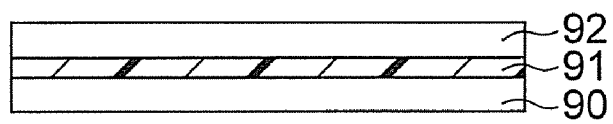
FIGS. 18A through 18C are cross-sectional views showing a method for manufacturing a semiconductor apparatus in accordance with the third embodiment.
Figure 18B:
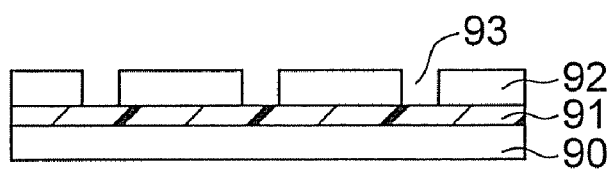
Figure 18C:
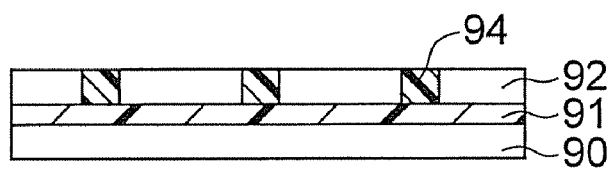

Referring now to FIGS. 18A through 21C, an example of the manufacturing process to be carried out when a connection to the outside is made through the cap layer 87 is described. First, a temporary adhesive layer 91 is formed on a substrate 90, as shown in FIG. 18A. A silicon substrate 92 is temporarily bonded onto the temporary adhesive layer 91, and the silicon substrate 92 is thinned. Vias 93 are then formed in the silicon substrate 92 by a dry etching technique such as DRIE or a wet etching technique (see FIG. 18B). The vias 93 are then filled with resist 94, as shown in FIG. 18C.

Figure 19A:
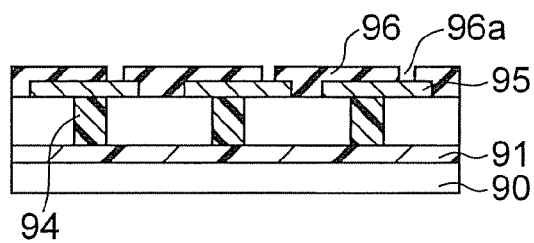
FIGS. 19A through 19C are cross-sectional views showing a method for manufacturing a semiconductor apparatus in accordance with the third embodiment.
Figure 19B:
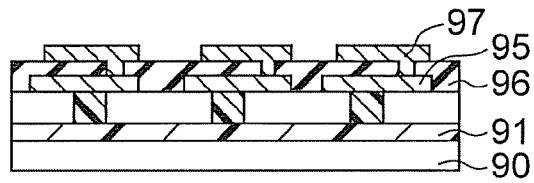
Figure 19C:
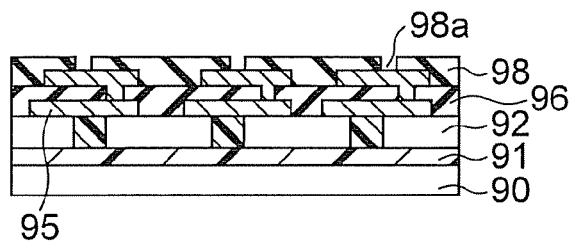

After a wiring layer 95 made of aluminum or the like is formed, an insulating layer 96 made of SiOx or the like is formed so as to cover the wiring layer 95, and contact holes 96a connecting to the wiring layer 95 are formed in the insulating layer 96, as shown in FIG. 19A. A wiring layer 97 is then formed so as to fill the contact holes 96a, and an insulating layer 98 so as to cover the wiring layer 97 (see FIGS. 19B and 19C). Thus, a multilayer structure is formed. Further, contact holes 98a to be in contact with the wiring layer 97 are formed in the insulating layer 98.

Figure 20A:
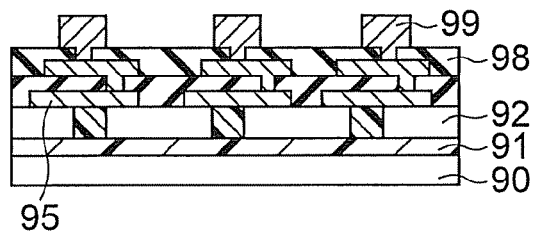
FIGS. 20A through 20C are cross-sectional views showing a method for manufacturing a semiconductor apparatus in accordance with the third embodiment.
Figure 20B:
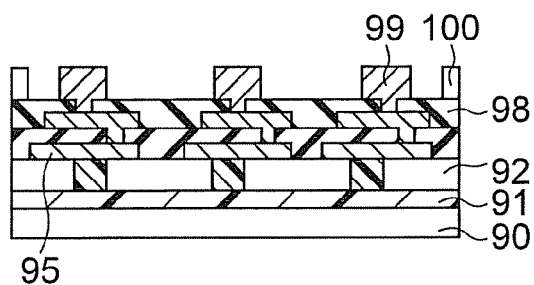
Figure 20C:
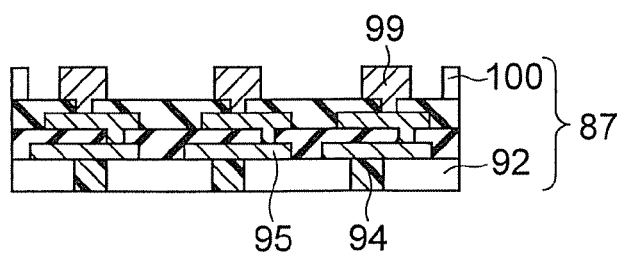

Next, bump pillars 99 are formed on the insulating layer 98, so as to fill the contact holes 98a, as shown in FIG. 20A. As shown in FIG. 20B, a sealing material 100 is provided on the insulating layer 98. As shown in FIG. 20C, the temporary adhesive layer 91 and the substrate 90 are removed, so as to form the cap layer 87.

Next, the cap layer 87 is bonded to a pseudo wafer having chips integrated, as shown in FIG. 21A. Here, the cap layer 87 is connected to pads 101 of the integrated chips via the bump pillars 99. As shown in FIG. 21B, the resist 94 filling the vias 93 is removed, and metal vias 102 are formed by a plating technique or the like. As shown in FIG. 21C, soldering ball layers 103 connecting to the metal vias 102 are formed. In this manner, a MEMS structure with a cap that can be connected with wires through the cap layer 87 is realized.

FIG. 22 is a cross-sectional view showing a semiconductor apparatus in accordance with a modification of this embodiment. The semiconductor apparatus of this modification has a bonded chip on which a MEMS chip 50 formed on a SOI substrate, a CMOS chip 75 formed on a SOI substrate, and a SOI chip 76 formed on a SOI substrate are mounted together with the use of the adhesive layers 59 and 61. Those chips have wires 81 formed on their surfaces. A substrate 82 that has an interlayer insulating film 80 covering the wires 81 is formed to cover the top surface. Here, the substrate 82 serves as a cap layer. Contacts 78 that connect to the wires and global wires 79 connecting the respective chips to one another are formed on the interlayer insulating film 80. An adhesive material 77 is applied to the outermost periphery of the interlayer insulating film 80, and the bonded chip and the substrate 82 are bonded to each other with the adhesive material 77. In other words, the chips 50, 75, and 76 of the bonded chip are sealed with the adhesive material 77. Further, contacts 83 penetrating through the substrate 82, and bumps 84 that are formed on the bottom face (the upper face in FIG. 22) of the substrate 82 and connect to the contacts 83 are formed on the substrate 82.

As in the third embodiment, there is no need to form wires on the interchip adhesive layer 59 and the burnout rate is reduced in this modification, as the connecting wires to the outside are formed through the cap layer 82. Also, the pseudo chip is held also by the cap layer 82, and accordingly, a more stable structure in terms of dynamics is obtained. Like the apparatus in accordance with the third embodiment, the apparatus of this modification can be highly integrated and thinned, even though MEMS devices and semiconductor devices are provided in the apparatus.

Fourth Embodiment

Figure 23:
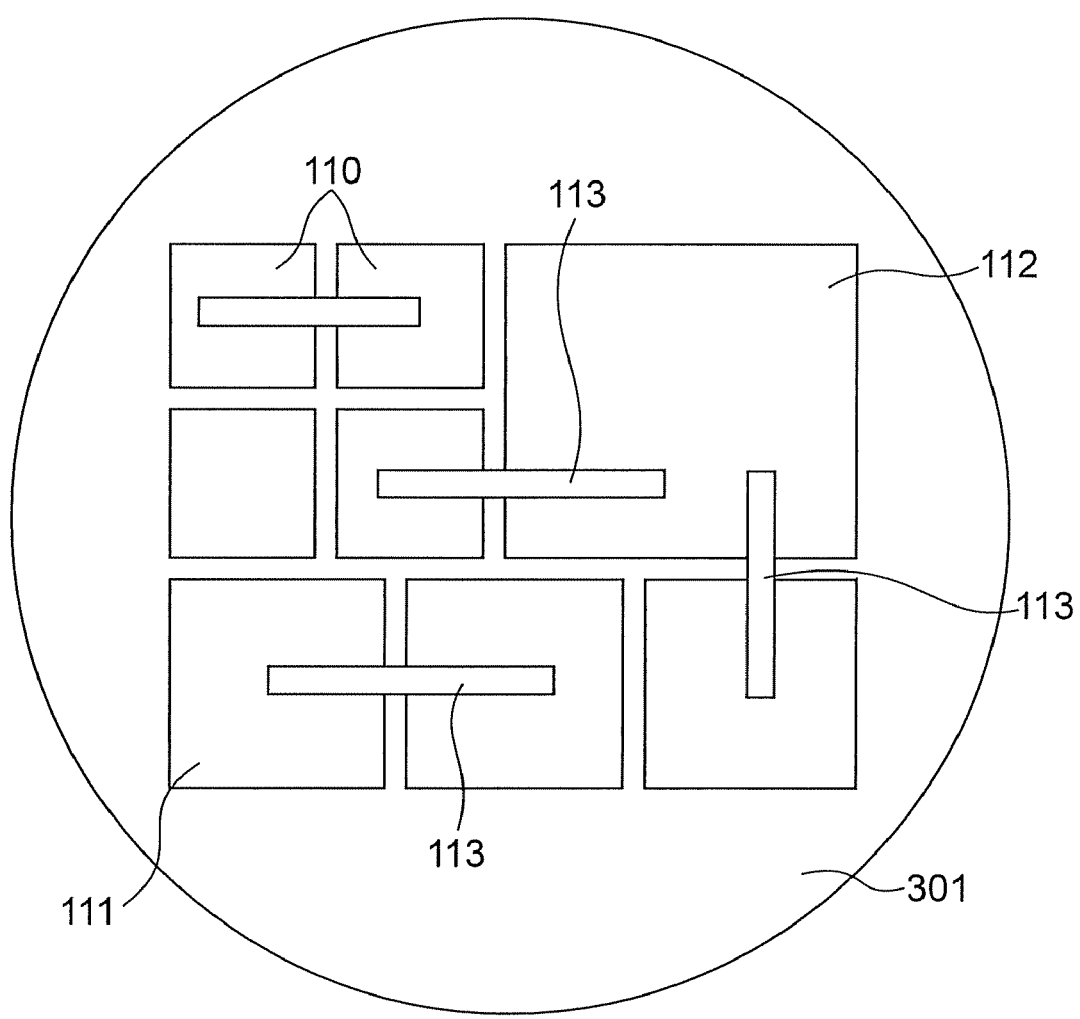
FIG. 23 is a plan view showing a semiconductor apparatus in accordance with a fourth embodiment.

FIG. 23 is a plan view showing a semiconductor apparatus in accordance with a fourth embodiment of the present invention. In the semiconductor apparatus of this embodiment, chips 110, 111, and 112 of different sizes and different types are mounted with an adhesive layer 301, and are electrically connected to one another with global wires 113. In this manner, the sizes of the chips may vary. In view of integration, the size of one of the chips of different types is preferably an integral multiple of the size of another one of the chips. For example, the size of the chip 110 is preferably about half the size of the chip 112.

Fifth Embodiment

Figure 24:
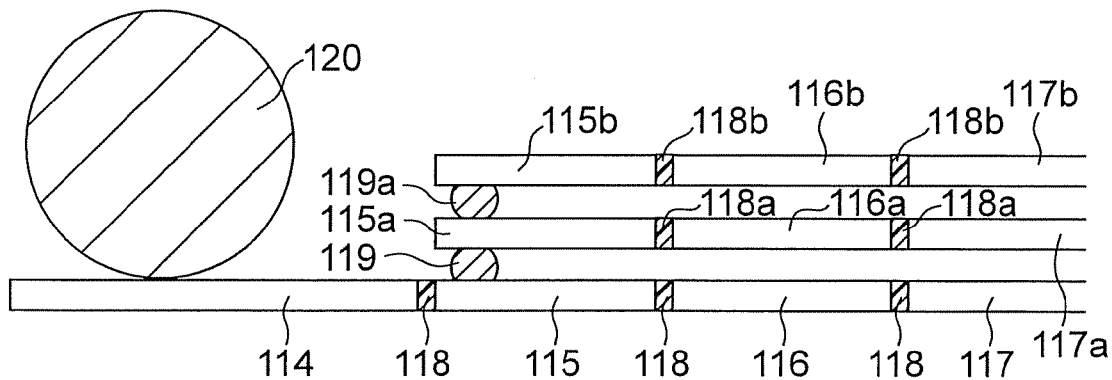
FIG. 24 is a cross-sectional view showing a semiconductor apparatus in accordance with a fifth embodiment.

FIG. 24 is a cross-sectional view showing a semiconductor apparatus in accordance with a fifth embodiment of the present invention. The semiconductor apparatus of this embodiment has a three-dimensional stack structure of pseudo chips. More specifically, the pseudo chip of the first layer has chips 114, 115, 116, and 117 bonded to one another with an interchip adhesive layer 118. The pseudo chip of the second layer has chips 115a, 116a, and 117a bonded to one another with an interchip adhesive layer 118a. The pseudo chip of the third layer has chips 115b, 116b, and 117b bonded to one another with an interchip adhesive layer 118b. The first-layer pseudo chip and the second-layer pseudo chip are connected to each other with minute bump pillars 119 having a pitch of approximately 20 μm. The second-layer pseudo chip and the third-layer pseudo chip are connected to each other with minute bump pillars 119a having a pitch of approximately 20 μm. For I/O terminals, a soldering bump 120 is formed on each end face of the first-layer pseudo wafer. The pseudo wafer of each layer is polished to a thickness of approximately 100 μm. Accordingly, a very thin multilayer pseudo-wafer structure with an apparatus thickness of 1 mm or less can be realized, even if a large number of layers are stacked.

Sixth Embodiment

Figure 25A:
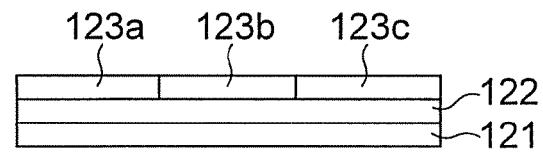
FIGS. 25A through 25B are cross-sectional views showing a semiconductor apparatus in accordance with a sixth embodiment.
Figure 25B:
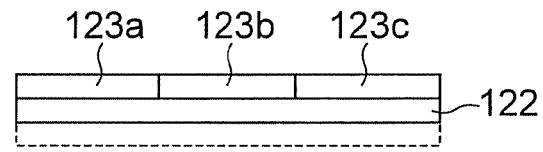

Referring now to FIG. 25A, a semiconductor apparatus in accordance with a sixth embodiment of the present invention is described. In the semiconductor apparatus of this embodiment, chips 123a, 123b, and 123c are bonded to an adhesive layer 122 formed on a supporting substrate 121. The chips 123a, 123b, and 123c are secured by the adhesive layer 122 and the supporting substrate 121, and interchip adhesive layers that are used in the first through fifth embodiments are not employed in this embodiment. As a result, the width of each interchip adhesive layer can be saved, and the apparatus can be more highly integrated. The supporting substrate 121 can be softened and thinned by polishing and etching. Alternatively, the supporting substrate 121 may be removed or eliminated, and the chips may be secured only by the adhesive layer 122, as shown in FIG. 25B.

Figure 26A:
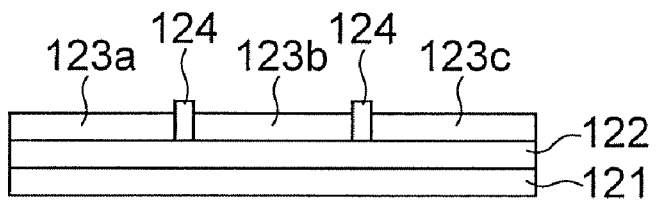
FIGS. 26A through 26C are cross-sectional views showing a semiconductor apparatus in accordance with a first modification of the sixth embodiment.
Figure 26B:
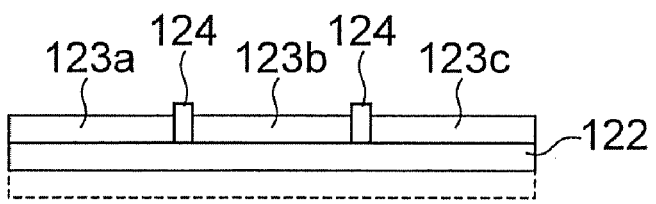
Figure 26C:
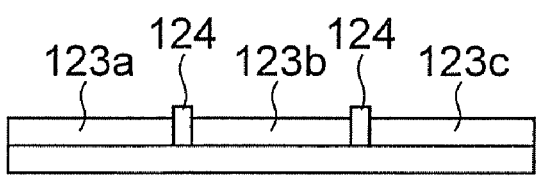

FIG. 26A is a cross-sectional view showing a semiconductor apparatus in accordance with a first modification of this embodiment. The semiconductor apparatus of this modification is the same as the semiconductor apparatus of the sixth embodiment, except that an interchip adhesive layer 124 is provided between each two chips. With this arrangement, the chips can be firmly secured. Alternatively, the supporting substrate 121 may be thinned or completely removed, as shown in FIG. 26B. In this manner, the apparatus can be made softer and thinner. Also, the adhesive layer 122 may be removed, and the chips may be secured only by the interchip adhesive layer 124, as shown in FIG. 26C.

Figure 27A:
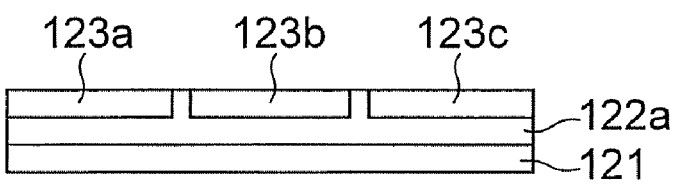
FIGS. 27A through 27B are cross-sectional views showing a semiconductor apparatus in accordance with a second modification of the sixth embodiment.
Figure 27B:
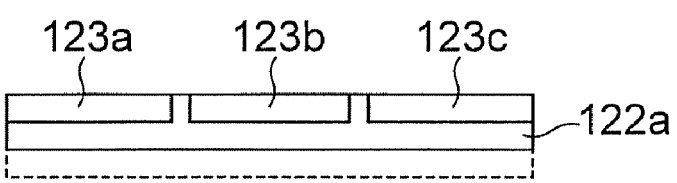

FIG. 27A is a cross-sectional view showing a semiconductor apparatus in accordance with a second modification of this embodiment. In the semiconductor apparatus of this modification, chips 123a, 123b, and 123c are embedded at regular intervals in an adhesive layer 122a formed on a supporting substrate 121. The adhesive layer 122a also fills the spaces between the chips. The structure of this modification is similar to that of the first modification, but the adhesive layer 122a can be formed as one layer. Thus, the manufacturing process can be simplified, and the production costs can be lowered. As shown in FIG. 27B, the supporting substrate 121 may be thinned or completely removed.

Seventh Embodiment

Figure 28A:
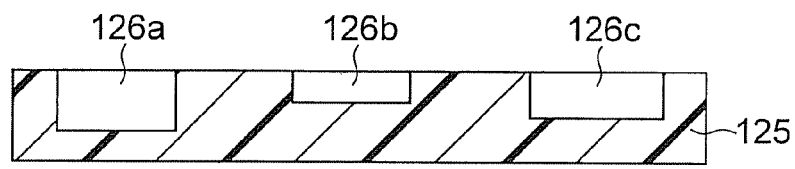
FIGS. 28A through 28D are cross-sectional views showing a method for manufacturing a semiconductor apparatus in accordance with a seventh embodiment.
Figure 28B:
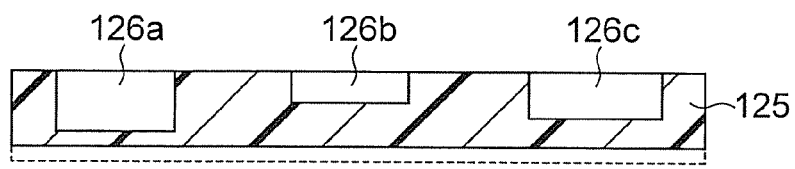

Referring now to FIGS. 28A through 28D, a method for manufacturing a semiconductor apparatus in accordance with a seventh embodiment of the present invention is described. By the manufacturing method in accordance with this embodiment, chips 126a, 126b, and 126c of different thicknesses are bonded onto an adhesive layer 125, so as to form a bonded chip that is to be flattened, as shown in FIG. 28A. To flatten the bonded chip through a polishing process, polishing is performed only on the adhesive layer 125, so as to flatten the bottom face of the adhesive layer 125, as shown in FIG. 28B. In this manner, the chips are firmly secured, without the formation of an adhesive layer under the chips, and the surface of the adhesive layer is flattened.

Figure 28C:
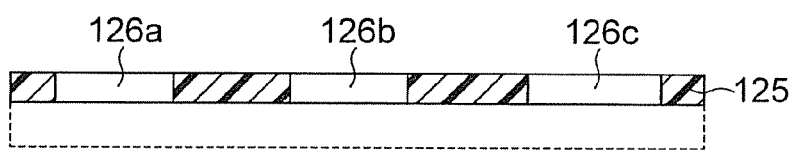

As shown in FIG. 28C, not only the adhesive layer 125 but also the chips may be flattened. In this manner, the resin of the adhesive layer 125 remains only between the chips, and the entire bonded chip can be made very thin. Since the adhesive layer 125 does not exist under the chips, an asymmetric diversity due to the difference in thermal expansion between the upper portion and the lower portion is not generated. Furthermore, the total thickness of the bonded chip is small, and the bonded chip is hardly warped. Even in this situation, the chips can be secured without a problem, as long as the adhesive layer 125 is made of a resin material with strong adhesion. For example, epoxy resin can firmly secure the chips, and there are no problems even when the epoxy resin exist only between the chips.

Figure 28D:
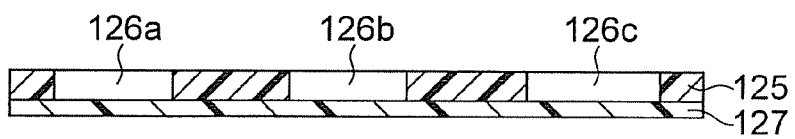

In the situation illustrated in FIG. 28C, a thin adhesive layer 127 may be formed under the chips, as shown in FIG. 28D. With this arrangement, the chips can be even more firmly secured, and a mechanically stable structure is obtained. Also, the adhesive layer 125 and the adhesive layer 127 may be made of different materials. This allows a higher degree of freedom in material design depending on the purposes of use.

Eighth Embodiment

Figure 29:
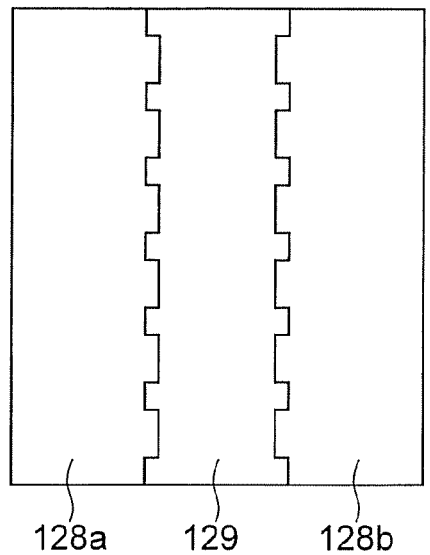
FIG. 29 is a cross-sectional view showing a semiconductor apparatus in accordance with an eighth embodiment.

Referring now to FIG. 29, a semiconductor apparatus in accordance with an eighth embodiment of the present invention is described. FIG. 29 is a cross-sectional view showing the vicinity area of an interchip adhesive layer of the semiconductor apparatus of this embodiment. The semiconductor apparatus of this embodiment has the same structure as any semiconductor apparatus of the first through fifth embodiments, except that the contact faces between the interchip adhesive layer 129 and chips 128a and 128b are not flat but are designed to have concavities and convexities, as shown in FIG. 29. In this manner, the contact areas between the interchip adhesive layer 129 and the chips 128a and 128b can be increased, and the adhesive strength can be increased accordingly. Especially, in a structure that does not have an adhesive layer formed under the chips and the resin of the adhesive layer remains only between the chips, increases of the contact areas between the adhesive layer and the chips are very effective.

Ninth Embodiment

Figure 30:
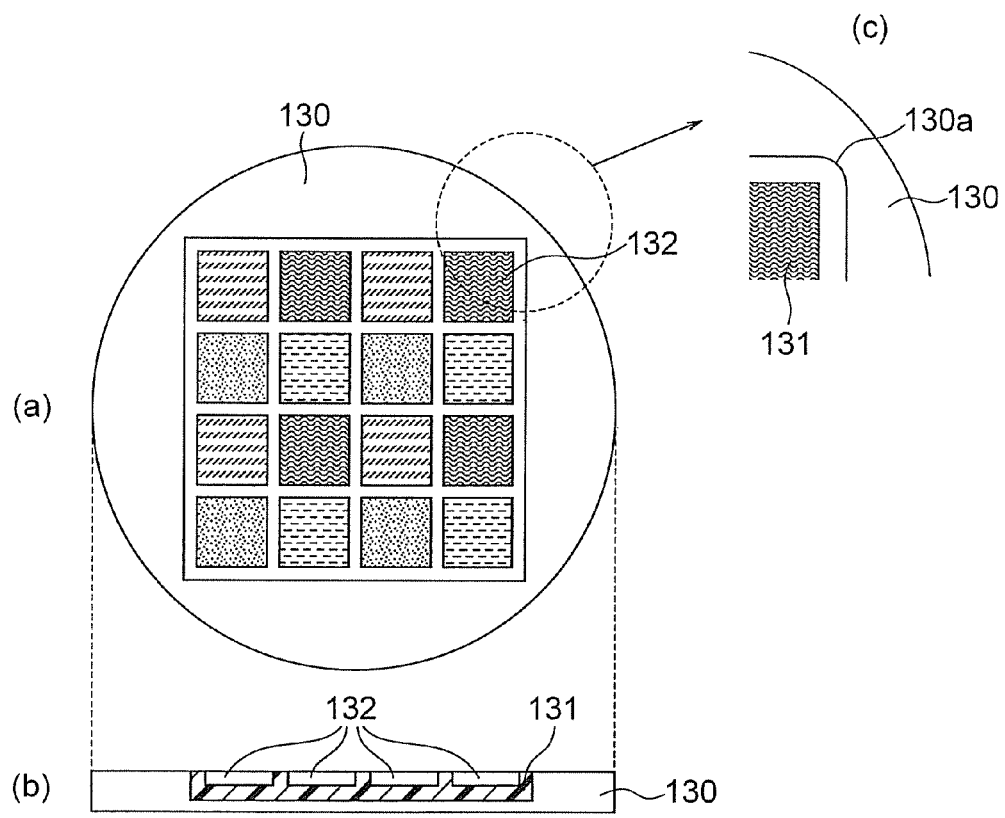
FIGS. 30(a), 30(b), and 30(c) illustrate the structure of a semiconductor apparatus in accordance with a ninth embodiment of the present invention.

Referring now to FIGS. 30(a), 30(b), and 30(c), a semiconductor apparatus in accordance with a ninth embodiment of the present invention is described. FIG. 30(a) is a plan view of the semiconductor apparatus in accordance with this embodiment. FIG. 30(b) is a cross-sectional view of the semiconductor apparatus in accordance with this embodiment. FIG. 30(c) is a partially enlarged view of the semiconductor apparatus in accordance with this embodiment. The semiconductor apparatus of this embodiment includes chips 132 that are surrounded by the frame of a base substrate 130. More specifically, a concave portion is formed in the base substrate 130, and the chips 132 are secured in the concave portion with an adhesive layer 131. Each corner of the concave portion of the base substrate 130 has a round portion 130a. The base substrate 130 is a silicon substrate in this example, but the same effects as above can be achieved with any other substrate such as a SOI substrate, a glass substrate, a sapphire substrate, or a GaAs substrate. With this structure, the bonded chips 132 can be more firmly secured. Even if impact is applied to the end faces of the chips 132, for example, the substrates of the chips 132 hardly break. Also, with the round portions 130a inside the frame, few cracks are formed in the base substrate 130. Even if the curvature radius of each round portion 130a is 10 μm, the resistance against cracks is sufficiently high.

In this embodiment, the chips 132 are held by the adhesive layer 131 under the bottom faces of the chips 132 and the frame of the base substrate 130. Accordingly, the structure is mechanically strong, and the same flatness as that of a conventional substrate is guaranteed for the bottom face of the base substrate 130. Here, 200-μm dry etching is performed on the center of a silicon substrate of 625 μm in thickness, so as to form a concave portion of 200 μm in depth. An epoxy adhesive agent is then applied to the bottom of the concave portion, so as to form the adhesive layer 131. The thin silicon chips 132 of 100 μm in thickness are then bonded and secured into the concave portion.

Figure 31A:
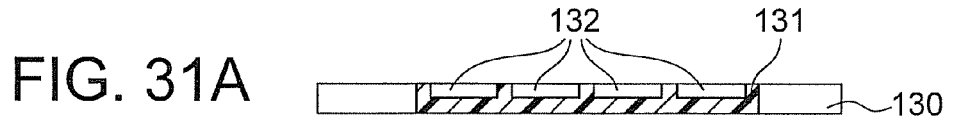
FIGS. 31A and 31B are cross-sectional views showing a semiconductor apparatus in accordance with a first and second modifications of a ninth embodiment.

In a first modification shown in FIG. 31A, the base substrate 130 is formed only with the frame on the side faces, and the chips 132 are secured only with the adhesive layer 131 at the bottom faces. Here, polishing is performed on the bottom face of the semiconductor apparatus formed in accordance with this embodiment, so that only the frame of the base substrate 130 remains. In this manner, a semiconductor apparatus of 200 μm in thickness can be produced. The semiconductor apparatus of this modification is thinner than the semiconductor apparatus of the ninth embodiment.

Figure 31B:
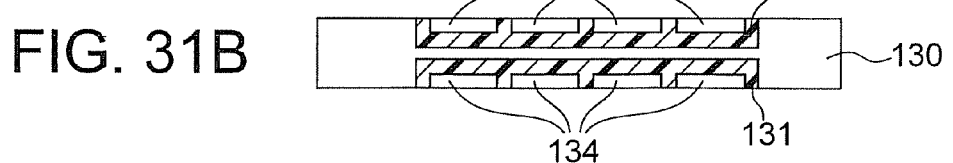

In a second modification shown in FIG. 31B, a pseudo chip structure is formed not only on the surface side but also on the bottom face side. More specifically, a concave portion of 200 μm in depth is formed on both faces of the silicon substrate 130 of 625 μm in thickness. An adhesive agent is then applied to the bottom of the concave portions, so as to form adhesive layers 131 and 133. The chips 132 are bonded to the adhesive layer 131, and chips 134 are bonded to the adhesive layer 133. The chips 132 and 134 are then integrated. Thus, the integration of the chips is made higher.

In this embodiment and the modifications, all the chips have the same sizes. However, the chips may have different sizes. However, with chips of the same sizes being formed with the same pitch, stress is evenly applied, and the substrates are hardly warped when heated. Thus, with chips of the same sizes, a more stable, stronger pseudo chip can be formed.

Figure 32:
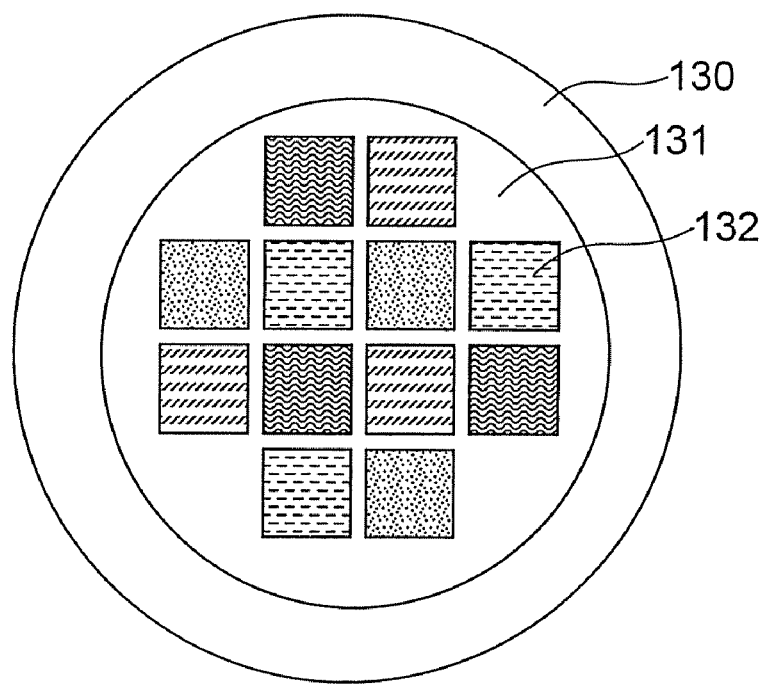
FIG. 32 is a plan view of a semiconductor apparatus in accordance with a third modification of the ninth embodiment.

FIG. 32 is a plan view showing a semiconductor apparatus in accordance with a third modification of this embodiment. In the semiconductor apparatus of this modification, the adhesive layer 131 is bonded to a concave portion having a round shape in a plan view. The chips 132 are bonded onto the adhesive layer 131, and are then integrated. In this modification, no corners exist, because the concave portion has a round shape. Accordingly, even fewer cracks are formed than in the ninth embodiment. Thus, an even stronger structure can be realized. In this structure, the arrangement of the chips should be made centrosymmetric, to achieve mechanical stability. With this arrangement, the effect of smaller warp in each substrate is achieved.

In this embodiment and the first through third modifications, the chips 132 are two-dimensionally arranged. However, in a fourth modification shown in FIG. 33, the chips (devices) 132 are three-dimensionally scattered in the adhesive layer 131. The chips 132 are connected with wires 135, so that a semiconductor apparatus that has multifunctional devices integrated in the adhesive layer 131 can be formed. More specifically, the chips 132 are scattered before the adhesive layer 131 is hardened. In this manner, the chips 131 can be scattered randomly. Alternatively, devices are formed beforehand in thin adhesive layers 131, and substrates having the adhesive layers are bonded to each other, so as to form a substrate formed with one adhesive layer.

Tenth Embodiment

Figure 34:
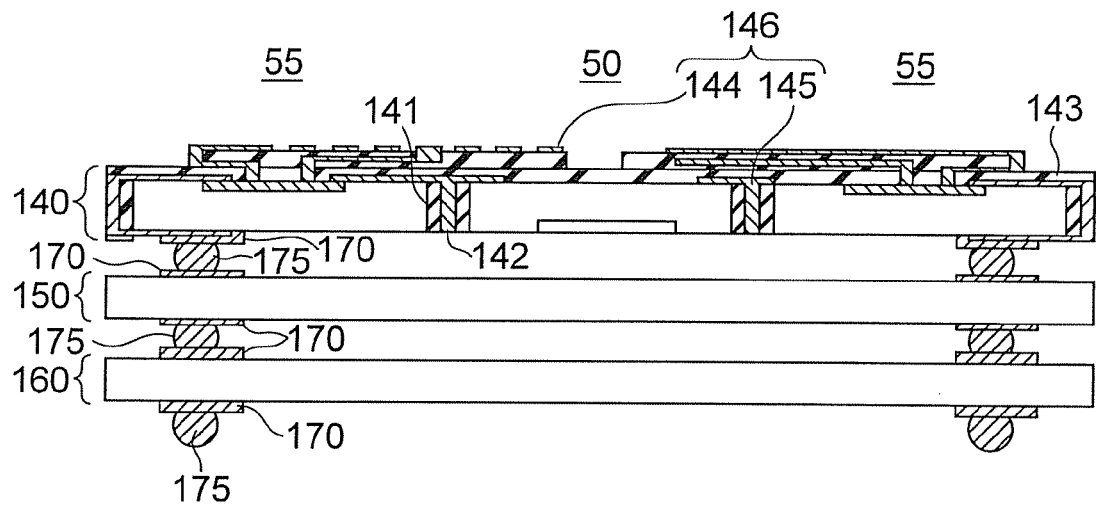
FIG. 34 is a cross-sectional view of a semiconductor apparatus in accordance with a tenth embodiment.

FIG. 34 is a cross-sectional view showing a semiconductor apparatus in accordance with a tenth embodiment of the present invention. The semiconductor apparatus of this embodiment is formed by turning different chips 50 and 55 into a pseudo chip and a stacked structure. A first layer 140 is a RF-MEMS layer. CMOS chips 55 and a MEMS chip 50 are bonded to one another with an interchip adhesive layer 141, and are turned into a pseudo chip and thus integrated. In this embodiment, the device face of the MEMS chip 50 is located on the opposite side from the device faces of the CMOS chips 55. With this arrangement, the MEMS device 50 is interposed between substrates, and is hardly affected by mechanical impact or electromagnetic external turbulence. Wires 142 that connect the devices are formed through the interchip adhesive layer 141. Here, the thickness of the bonded chip 140 is in the range of 100 μm to 300 μm. After the structure is turned into a pseudo chip, an insulating film 143 is formed on the bonded chip 140, and a RF passive thin-film component 146 that includes an inductor and a capacitor is formed on the insulating film 143. A CPU layer 150 as a second layer and a memory layer 160 as a third layer are stacked on the RF-MEMS layer 140. Those layers 140, 150, and 160 are joined to one another with bumps 175 formed with soldering balls via electrode pads 170. The electrode pads 170 of the first layer 140 are connected with wiring layers 142 formed in the adhesive layer 141.

Figure 35:
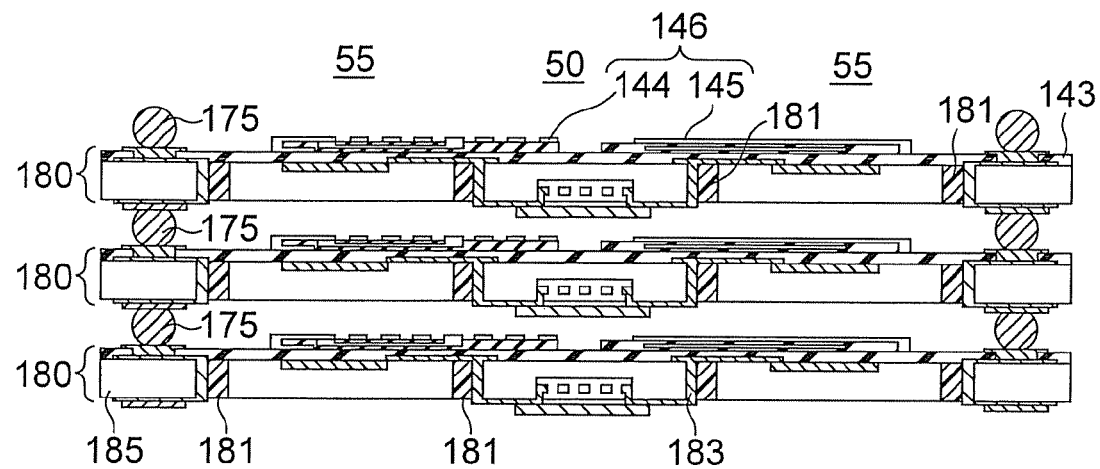
FIG. 35 is a cross-sectional view of a semiconductor apparatus in accordance with a modification of the tenth embodiment.

FIG. 35 is a cross-sectional view showing a semiconductor apparatus in accordance with a modification of this embodiment. The semiconductor apparatus of this modification also is a structure formed by stacking pseudo chips. In this modification, three pseudo SOC layers 180 each having CMOS chips 55 and a MEMS chip 50 turned into a pseudo chip with an adhesive layer 181 are stacked. This stacked structure differs from the structure of FIG. 34 in the shape of each soldering bump 175. In this modification, a frame 185 for the soldering bumps 175 is formed at the outer periphery. This frame 185 is bonded and secured to the CMOS chips 55 with the adhesive layer 181, for example. With the frame 185, the mechanical stability of each pseudo chip is increased. However, the structure of this embodiment shown in FIG. 34 excels in device integration. An interlayer insulating film 143 is provided on each pseudo SOC layer 180, and a passive thin-film component 146 that includes an inductor 144 and a capacitor 145 is formed on the interlayer insulating film 143. The chips are connected to one another with global wires 183.

Eleventh Embodiment

Figure 36A:
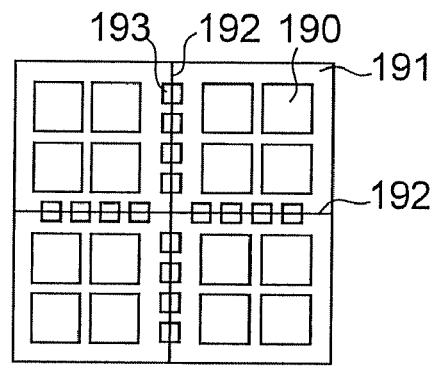
FIGS. 36A through 36D are views showing a method for manufacturing a semiconductor apparatus in accordance with an eleventh embodiment.
Figure 36B:
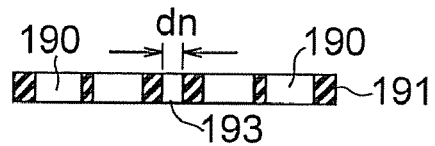
Figure 36C:
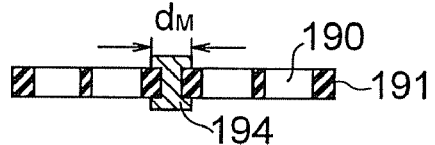
Figure 36D:
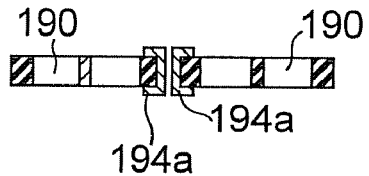

Referring now to FIGS. 36A through 36D, a method for forming wires on the end faces of each substrate of a semiconductor apparatus in accordance with an eleventh embodiment of the present invention is described. FIG. 36A is a plan view showing the semiconductor apparatus of this embodiment. FIGS. 36B through 36D are cross-sectional views of the semiconductor apparatus of this embodiment. First, as shown in FIGS. 36A and 36B, a bonded chip is formed by integrating and securing chips 190 with an adhesive layer 191, and through holes 193 are formed along cutting lines 192 in the adhesive layer 191. The diameter of each of the through holes 193 is in the range of 30 μm to 60 μm. As shown in FIG. 36C, the through holes 193 are filled with metal by a plating technique or the like, so as to form metal electrodes 194. The diameter of each of the metal electrodes 194 is in the range of 50 μm to 100 μm. The structure is then cut along the cutting lines 192 that pass through the centers of the through holes 193 in the adhesive layer 191, and is divided into pseudo chips. As a result, wires 194a are formed at end faces of the pseudo chips in the adhesive layer 191, and the upper face of the bottom face of each chip are electrically connected.

Figure 37A:
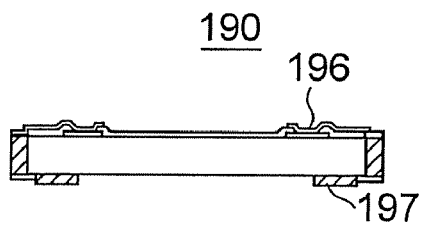
FIGS. 37A and 37B illustrate a chip manufactured by a manufacturing method in accordance with the eleventh embodiment.
Figure 37B:
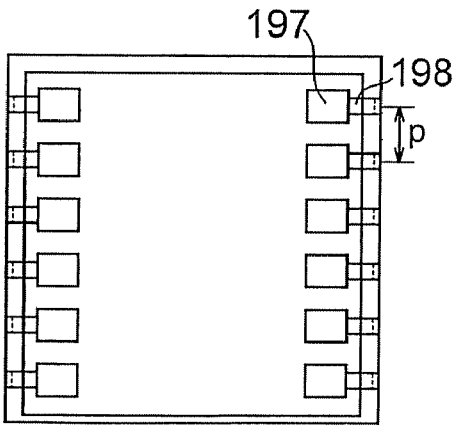

As shown in FIGS. 37A and 37B, I/O pads 197 are provided on the bottom face of each chip 190 formed in the above described manner, and I/O units 196 are provided on the upper face. The I/O pads 197 are connected to one another with branch wires 198 that pass through the end faces of the each chip 190. If the size of each chip 190 is 4 mm×4 mm, the I/O pads 197 are arranged with pitch p of 100 μm to 200 μm.

Twelfth Embodiment

Figure 38:
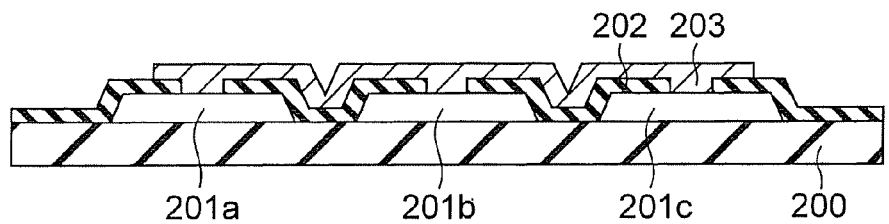
FIG. 38 is a cross-sectional view of a semiconductor apparatus in accordance with a twelfth embodiment.

FIG. 38 is a cross-sectional view of a semiconductor apparatus in accordance with a twelfth embodiment of the present invention. In the semiconductor apparatus of this embodiment, chips 201a, 201b, and 201c are secured on an adhesive layer 200, and a flattening layer 202 and a wiring layer 203 are formed over the chips. This embodiment is characterized in that the end faces of the chips 201a, 201b, and 201c are tapered. With this arrangement, the wires 203 hardly break, even if the flattening layer 202 is thin. Although the chips 201a, 201b, and 201c are not embedded in the adhesive layer 200 in FIG. 38, they may be embedded in the adhesive layer 200, so that the tapered end faces of the chips can be firmly secured in the adhesive layer 200. Thus, the chips can be more firmly held.

Thirteenth Embodiment

Referring now to FIGS. 39A through 42B, a method for manufacturing a semiconductor apparatus in accordance with a thirteenth embodiment of the present invention is described. FIGS. 39A through 42B are cross-sectional views showing the procedures in accordance with the manufacturing method of this embodiment.

Figure 39A:
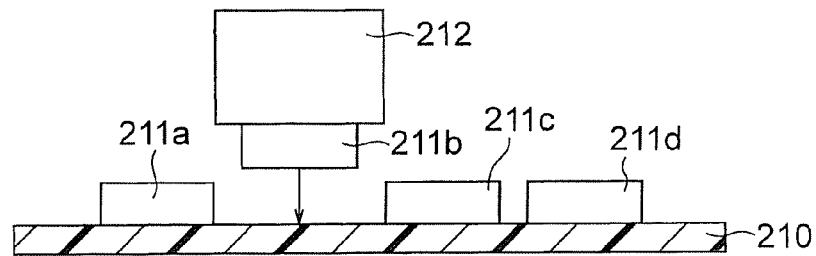
FIGS. 39A through 39B are cross-sectional views showing a method for manufacturing a semiconductor apparatus in accordance with the thirteenth embodiment.
Figure 39B:
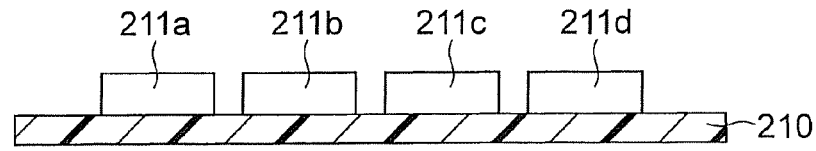

First, as shown in FIGS. 39A and 39B, chips 211a through 211d are placed in predetermined positions on an adhesive sheet 210 by a pickup device 212. Here, silicon chips that are thinned to approximately 100 μm are used. CMOS devices and MEMS devices are formed in the silicon chips 211a through 211d. The pickup device 212 has a vacuum suction mechanism. With this arrangement, the chips can be moved and mounted with high yield, without stains on the surface. The pickup device 212 may have a pickup function in the form of an adhesive layer or the like. With the adhesive layer, minute chips of 10 μm to 900 μm, or thin chips of 10 μm to 900 μm in thickness can be picked up without being damaged. However, to transfer the chips from the adhesive layer of the pickup device 212 onto the adhesive sheet 210, it is necessary to generate great adhesiveness at the time of moving the chips, and small adhesiveness at the time of transferring the chips. Therefore, an adhesive material that has removing force that varies with UV ray or laser beam irradiation or temperature is used as the adhesive layer of the pickup device 212. With such a material, the chips can be transferred onto the adhesive sheet 210 with high yield.

Figure 40A:
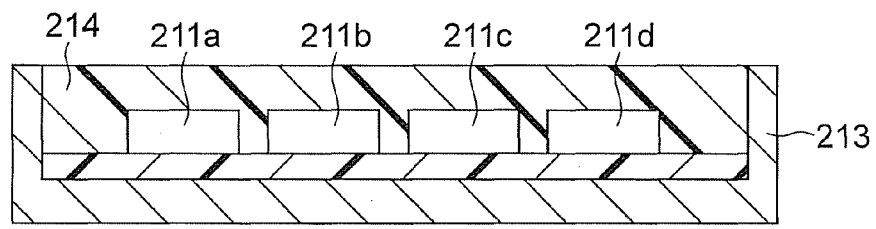
FIGS. 40A through 40B are cross-sectional views showing a method for manufacturing a semiconductor apparatus in accordance with the thirteenth embodiment.

Next, as shown in FIG. 40A, the chips 211a through 211d integrated on the adhesive sheet 210 are put in a metal mold 213, and an adhesive layer 214 is formed so as to cover the chips. Here, a sample is produced. The concavity of the metal mold 213 is 5 inches in diameter and 300 μm in thickness. Epoxy resin 214 with a thickness of approximately 300 μm is then applied over the chips by a printing technique. The adhesive resin 214 is not limited to epoxy resin, but may be acrylic resin, polyimide resin, silicone resin, or the like. For example, a resin layer made of a relatively soft resin material such as silicone resin or polyimide resin, or a resin layer having a low glass transition temperature is formed with a small thickness, so as to form a chip assembly that has flexibility. If a hard material such as epoxy resin is employed, a strong chip-integrated structure having a small thickness can be realized.

Figure 40B:
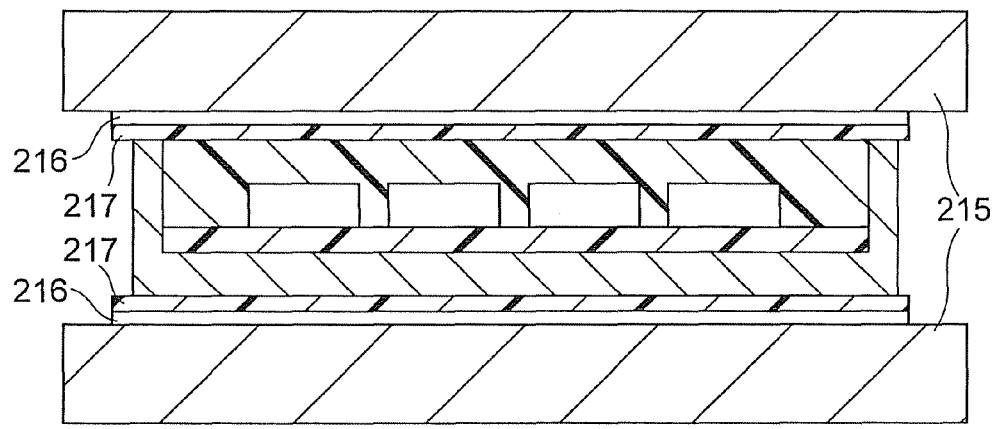

Next, as shown in FIG. 40B, after the application of the epoxy resin 214, the sample is prebaked with a hot press device 215. First, the hot press device 215 presses and heats the sample at the top and the bottom at 100° C., with the pressure of 10 kN, for one hour. After one hour has passed, the temperature in the pressed state is gradually reduced to room temperature. When pressing is performed, spacers 216 are attached to the upper face and the bottom face of the sample, so as to increase the adhesion between the sample and the heating faces. The spacers 216 are made of a heat-resisting rubber such as silicone rubber. Further, a polyimide film 217 of 50 μm in thickness may be inserted between each spacer 216 and the sample. With this arrangement, bonding between the sample and the spacers 216 can be prevented.

Figure 41A:
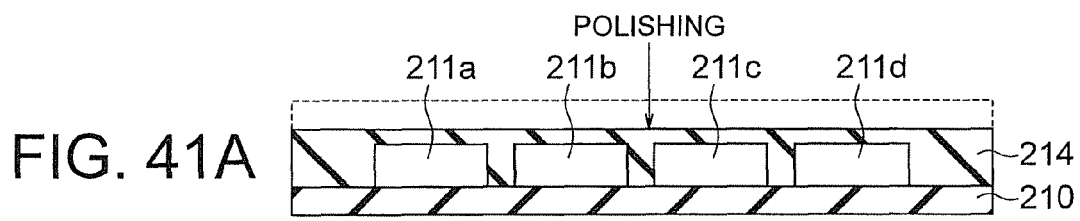
FIGS. 41A through 41C are cross-sectional views showing a method for manufacturing a semiconductor apparatus in accordance with the thirteenth embodiment.
Figure 41B:
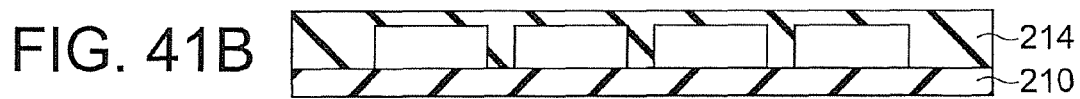
Figure 41C:

The sample is pulled out from the hot press device 215 when the atmosphere is cooled to room temperature, and the spacers 216 and the films 217 are removed. As shown in FIG. 41A, polishing is performed on the upper face of the resin 214 is flattened and thinned. Through this polishing, the total film thickness of the silicon chips 211a through 211d and the adhesive layer 214 is reduced to 125 μm. Since the height of each of the silicon chips 211a through 211d is 100 μm, the adhesive layer 214 of 25 μm in thickness exists under the silicon chips 211a through 211d (see FIG. 41B). As the thickness of the adhesive layer 214 is smaller, the warp in the resin substrate having the chips sealed with the adhesive layer 214 tends to be smaller. If the adhesive layer 214 has a large thickness, warp by the thermal stress in the adhesive layer 214 is considered to add to the thickness. Particularly, when large portions of the adhesive layer 214 remain under the chips, warp is likely to be caused due to the difference in stress between the adhesive layer 214 and the chips. Therefore, a sample that does not have the adhesive layer 214 remaining under the chips is formed, as shown in FIG. 41C. This sample has the substrate symmetric in the vertical direction, and the warp is smallest. The adhesive sheet 210 is then removed, as shown in FIG. 41C. In this embodiment, UV removal resin is used as the adhesive sheet 210. To generate removing force, UV rays are emitted for one minute, and the adhesive sheet 210 can be easily removed. It is also possible to use a thermal removal sheet as the adhesive sheet 210. In this case, heating is performed to readily remove the adhesive sheet 210. Here, the flatness of the surface of the adhesive layer 214 on the chip side is the flatness transferred from the surface of the adhesive material of the adhesive sheet 210. This is supposedly caused because the surface of the adhesive material is closely coated with an adhesive agent. Accordingly, the flatness of the adhesive layer 214 can be increased by increasing the flatness of the adhesive material. For example, a thin adhesive material of 1 μm to 2 μm in thickness is used to increase the flatness of the adhesive material, and, as a result, the flatness of the adhesive layer 214 can be increased. Instead of an adhesive material, a release film that has a fluorine-terminal surface may be used. Also, instead of an adhesive material, a removal layer not made of an adhesive material and a supporting substrate may be prepared. Devices are then bonded and secured with adhesive resin, and the chip-integrated substrate are then removed or eliminated. For example, an amorphous silicon layer is formed as a sacrifice layer on a glass substrate, and, at the time of removal, laser beams are emitted onto the amorphous silicon so that the amorphous silicon is abraded and then removed. Alternatively, a glass substrate coated with an organic thin film with acid resistance such as a polyimide film is prepared, and chips are thermally pressed onto the polyimide. Adhesive resin is then applied over the chips. After baking, etching with a solution of fluorine or the like is performed on the glass substrate, so as to remove the glass substrate. In this manner, the chip-integrated substrate can be removed from the glass. Here, the device face is not damaged, being covered with a resin material having acid resistance, such as polyimide. The adhesive resin should preferably be made of a material having acid resistance, such as polyimide. If a material without having acid resistance is used, the surface of the adhesive layer needs to be covered with resin having acid resistance or a material having acid resistance.

Figure 42A:
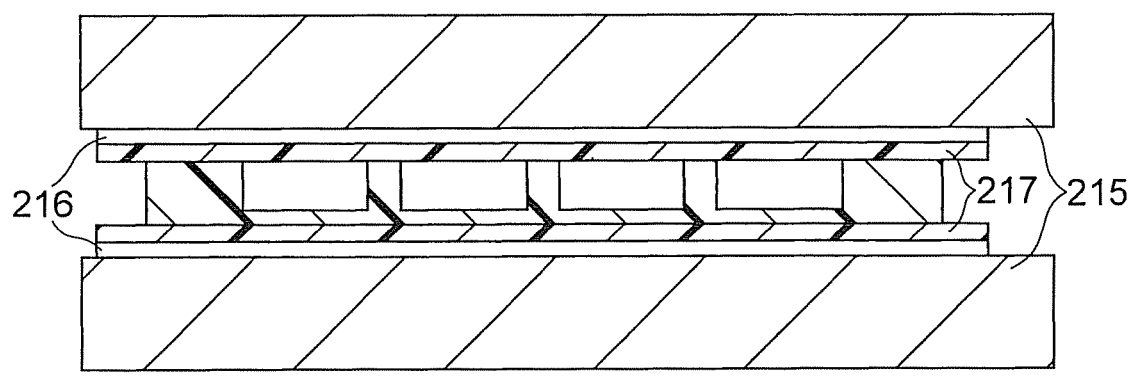
FIGS. 42A through 42B are cross-sectional views showing a method for manufacturing a semiconductor apparatus in accordance with the thirteenth embodiment.
Figure 42B:
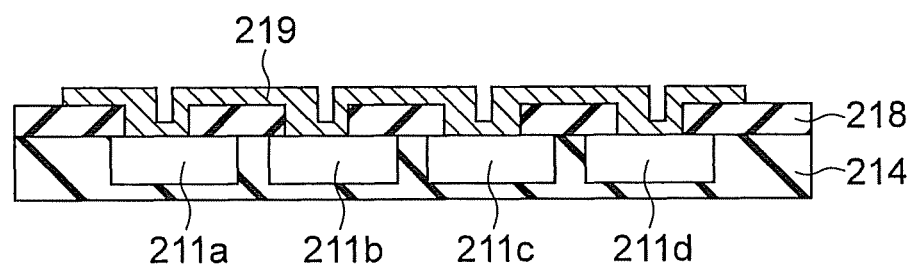

Next, baking is performed, as shown in FIG. 42A. To mold the sample back into a flattened form, the hot press device 215 performs a hot pressing operation (150° C., 10 kN, 1 hour). After one hour has passed, the atmosphere in the pressed state is cooled to room temperature, and the sample is then pulled out. When the hot pressing operation is performed, the spacers 216 and the films 217 are placed on the upper face and the bottom face of the sample, so as to prevent bonding between the sample and the spacers 216. The films 217 are made of Teflon or polyimide to have excellent heat resistance and removing force. The spacers 216 are made of heat-resisting rubber such as silicone, to have excellent characteristics including flatness. The flatness of the spacers 216 and the films 217 is also a critical factor for the flatness of the surface of the adhesive layer. Through the hot pressing operation, the flatness of the adhesive layer is greatly affected by the flatness of the spacers 216 and films 217, especially the flatness of the films 217 in contact with the adhesive layer. During a cold pressing operation, the temperature variations of the upper heating plate and the lower heating plate should be made substantially the same, so as to reduce the warp. Accordingly, the spacers 216 on and below the sample should preferably have symmetric structures. In this manner, a chip-integrated structure that has excellent flatness and smaller warp can be formed.

Next, a multilayer wiring layer is formed on the baked sample, as shown in FIG. 42. More specifically, a polyimide thin film of 4 μm in thickness is first formed as an insulating film 218. After contact holes are formed in the insulating film 218, a thin-film wiring layer 219 of 0.3 μm in thickness is formed so as to fill the contact holes. Here, an aluminum thin film is used as the thin-film wiring layer 219. The procedures are repeated to form the multilayer wiring layer.

In the first through thirteenth embodiments, a resin material having a Young's modulus of 10 GPa or less should be employed as the adhesive layer for bonding the chips, so as to achieve the sufficient buffering effect described in the first embodiment.

As described so far, in accordance with the above described embodiments, it is possible to form a chip in which devices of different kinds, such as MEMS devices that have been difficult to mount together with other devices, and silicon devices that have optical devices of GaAs or the like and CMOS circuits, are integrated. Particularly, wires can be formed with very small pitch of 1 μm or less can be formed, since global wires between the different devices mounted together can be formed by a semiconductor process. Also, existing, conventional chips can also be mounted. Thus, the development costs can be lowered, and the development period can be shortened. Further, low-yield chips are selected and mounted, so as to increase the total yield. In this manner, the advantages of SOC and the advantages of the SIP are both achieved. Thus, unprecedented, highly functional devices can be produced at low costs.

Also, in the chip-integrated substrate, the adhesive layer is made of a soft resin material having a low glass transition temperature, so as to serve as a stress absorbing layer that absorbs stress caused by the different in thermal expansion between the substrates. Thus, a larger number of device chips of different kinds can be readily and stably integrated.

As described so far, in accordance with each of the embodiments of the present invention, a semiconductor apparatus can be highly integrated and thinned, even though MEMS devices and semiconductor devices are contained in the apparatus.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concepts as defined by the appended claims and their equivalents.

What is claimed is:

1. A method for manufacturing a semiconductor apparatus, comprising:
   forming a plurality of semiconductor devices on a first semiconductor substrate;
   forming a first protection film that covers the plurality of semiconductor devices;
   temporarily bonding the first protection film to a first temporary adhesive layer that is formed on a surface of a first substrate that is independent of the first semiconductor substrate;
   forming a plurality of semiconductor chips by cutting the first semiconductor substrate and dividing the plurality of semiconductor devices;
   removing one of the semiconductor chips from the first temporary adhesive layer by selectively picking up the one semiconductor chip;
   temporarily bonding and transferring the picked-up semiconductor chip onto a second adhesive layer that is formed on a surface of a second substrate that is independent of the first substrate;
   forming a plurality of MEMS devices on a second semiconductor substrate that is independent of the first semiconductor substrate;
   forming a second protection film that covers the plurality of MEMS devices;
   temporarily bonding the second protection film to a third temporary adhesive layer that is formed on a surface of a third substrate that is independent of the first substrate and the second substrate;
   forming a plurality of MEMS chips by cutting the second semiconductor substrate and dividing the plurality of MEMS devices;
   removing one of the MEMS chips from the third temporary adhesive layer by selectively picking up the one MEMS chip;
   temporarily bonding and transferring the picked-up MEMS chip onto the second temporary adhesive layer formed on the surface of the second substrate;
   forming a first adhesive layer so as to cover the MEMS chip and the semiconductor chip and to fill a space between the MEMS chip and the semiconductor chip;
   making the heights of the MEMS chip and the semiconductor chip equal to each other with respect to the second temporary adhesive layer by polishing the first adhesive layer; and
   removing the MEMS chip and the semiconductor chip from the second temporary adhesive layer by bonding the MEMS chip and the semiconductor chip to a second adhesive layer that is formed on a supporting substrate.

2. The method according to claim 1, wherein the making of the heights of the MEMS chip and the semiconductor chip equal to each other with respect to the second temporary adhesive layer further comprises polishing at least one of the MEMS chip and the semiconductor chip.

3. The method according to claim 2, wherein the second adhesive layer is formed of one of polyimide resin, epoxy resin, and acrylic resin.

4. The method according to claim 2, further comprising removing the first and second protection films.

5. The method according to claim 4, further comprising forming a flattening layer on the semiconductor chip and between the semiconductor chip and the MEMS chip, on the first adhesive layer, after the removing of the first and second protection films.

6. The method according to claim 5, wherein the flattened layer is formed of polyimide resin.

7. The method according to claim 5, further comprising forming a wiring layer on the flattened later to connect the MEMS chip with the semiconductor chip.

8. The method according to claim 7, wherein a multi wiring layer is formed by forming of the flattened layer and the wiring layer iteratively.

9. The method according to claim 7, further comprising forming a passivation film on the wiring layer.

10. The method according to claim 7, further comprising:
    temporarily bonding an upper face of the MEMS chip and an upper face of the semiconductor chip to a fourth temporary adhesive layer on a second supporting substrate after the forming of the wiring layer; and
    thinning, removing, or isolating the first supporting substrate.

11. The method according to claim 10, further comprising removing the MEMS chip and the semiconductor chip from the fourth temporary adhesive layer.

12. The method according to claim 11, further comprising forming a cap layer on the MEMS chip after removing of the fourth temporary adhesive layer.

13. The method according to claim 12, wherein the cap layer is formed of silicon.

14. The method according to claim 11, after the removing of the fourth temporary adhesive layer, further comprising forming an electrode pad on the wiring layer and forming a bump layer on the electrode pad, thereby forming a first semiconductor apparatus.

15. The method according to claim 14, further comprising:
    forming a second semiconductor apparatus; and
    stacking the first semiconductor apparatus and the second semiconductor apparatus with interposing the bump layer therebetween to electrically connect the second semiconductor apparatus with the first semiconductor apparatus.

* * * * *